(12) United States Patent
Kimoto

(10) Patent No.: US 11,682,681 B2
(45) Date of Patent: Jun. 20, 2023

(54) ACTIVE MATRIX SUBSTRATE AND METHOD FOR MANUFACTURING SAME

(71) Applicant: SHARP KABUSHIKI KAISHA, Sakai (JP)

(72) Inventor: Hidenobu Kimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 379 days.

(21) Appl. No.: 17/070,716

(22) Filed: Oct. 14, 2020

(65) Prior Publication Data

US 2021/0118910 A1  Apr. 22, 2021

Related U.S. Application Data

(60) Provisional application No. 62/916,471, filed on Oct. 17, 2019.

(51) Int. Cl.
*H01L 27/12* (2006.01)
*H01L 29/786* (2006.01)

(52) U.S. Cl.
CPC ........ *H01L 27/1288* (2013.01); *H01L 27/124* (2013.01); *H01L 27/127* (2013.01); *H01L 27/1251* (2013.01); *H01L 29/78633* (2013.01)

(58) Field of Classification Search
CPC ........... H01L 27/1288; H01L 29/78633; H01L 27/127; G02F 1/136209; H10K 59/126
See application file for complete search history.

(56) References Cited

U.S. PATENT DOCUMENTS

| | | |
|---|---|---|
| 2001/0045996 A1 | 11/2001 | Kawai et al. |
| 2003/0025848 A1 | 2/2003 | Sera et al. |
| 2012/0138922 A1 | 6/2012 | Yamazaki et al. |
| 2012/0188478 A1* | 7/2012 | Kuwabara ........... H01L 27/1288 438/22 |
| 2013/0214273 A1 | 8/2013 | Yamazaki et al. |
| 2013/0320334 A1 | 12/2013 | Yamazaki et al. |
| 2014/0183532 A1 | 7/2014 | Yamazaki et al. |
| 2014/0286076 A1 | 9/2014 | Aoki et al. |
| 2015/0179805 A1 | 6/2015 | Yamazaki et al. |
| 2016/0240694 A1 | 8/2016 | Yamazaki et al. |
| 2017/0033229 A1 | 2/2017 | Yamazaki et al. |

(Continued)

FOREIGN PATENT DOCUMENTS

| | | |
|---|---|---|
| JP | H1020336 A | 1/1998 |
| JP | 2004-302475 A | 10/2004 |

(Continued)

*Primary Examiner* — Peter M Albrecht
(74) *Attorney, Agent, or Firm* — ScienBiziP, P.C.

(57) ABSTRACT

A method for manufacturing an active matrix substrate includes: (A) a step of forming a laminated film including a lower conductive film, a lower insulating film, and a semiconductor film in this order on a substrate; (B) a step of forming a first resist layer; (C) a step of performing a patterning on the laminated film, the step including, in the first formation region, forming the first substructure including a first lower conductive layer, a first lower insulating layer, and a first semiconductor layer respectively formed from the lower conductive film, the lower insulating film, and the semiconductor film, and (D) a step of forming source and drain electrodes electrically connected to the first semiconductor layer.

7 Claims, 14 Drawing Sheets

(56) References Cited

U.S. PATENT DOCUMENTS

| | | |
|---|---|---|
| 2017/0309751 A1 | 10/2017 | Yamazaki et al. |
| 2017/0309754 A1 | 10/2017 | Yamazaki et al. |
| 2018/0308989 A1 | 10/2018 | Yamazaki et al. |

FOREIGN PATENT DOCUMENTS

| | | |
|---|---|---|
| JP | 2012134475 A | 7/2012 |
| JP | 2013-084977 A | 5/2013 |
| JP | 2014-007399 A | 1/2014 |
| JP | 2014209727 A | 11/2014 |

\* cited by examiner

ACTIVE MATRIX SUBSTRATE AND METHOD FOR MANUFACTURING SAME

CROSS-REFERENCE TO RELATED APPLICATION

The present application claims priority from Provisional Application No. 62/916,471, the content to which is hereby incorporated by reference into this application.

BACKGROUND

1. Field

The disclosure relates to active matrix substrate and a method for manufacturing the same.

2. Description of the Related Art

Active matrix substrates used for display devices include a display region including a plurality of pixel regions and a non-display region other than the display region (which is referred to as a "frame region" or a "peripheral region"). The pixel region is a region corresponding to a pixel of the display device. In each pixel region, a thin film transistor (hereinafter, referred to as a "TFT") is arranged as a switching element. The TFT arranged in each pixel region is referred to as a "pixel TFT". As the pixel TFT, for example, a TFT having an amorphous silicon film as an active layer (hereinafter, an "amorphous silicon TFT"), a TFT having a polycrystalline silicon film as an active layer (hereinafter, a "polycrystalline silicon TFT"), a TFT having an oxide semiconductor film as an active layer (hereinafter, "an oxide semiconductor TFT"), and the like are used. For example, Japanese Unexamined Patent Application Publication No. 2004-302475 and Japanese Unexamined Patent Application Publication No. 2013-084977 use a polycrystalline silicon TFT having a top gate structure as a pixel TFT.

In the non-display region of the active matrix substrate, a drive circuit such as a gate driver circuit is monolithically (integrally) formed in some cases. The drive circuit has, for example, a complementary metal oxide semiconductor (CMOS) configuration including a p-channel type TFT (hereinafter abbreviated as a "p-type TFT") and an n-channel type TFT (hereinafter abbreviated as an "n-type TFT"). A TFT that is arranged in the non-display region and constitutes the drive circuit or the like as described above is referred as a "circuit TFT". The pixel TFT and the circuit TFT are formed using the same semiconductor film, for example.

SUMMARY

It is necessary to use a plurality of photomasks when manufacturing an active matrix substrate. As the number of photomasks used increases, it is likely that a manufacturing cost increases, a photomask manufacturing time (turn around time (TAT)) increases, and so on. In particular, when monolithically forming a drive circuit on an active matrix substrate or adding functions such as an in-cell type touch panel, a metal layer different from a source metal layer and a gate metal layer may be separately provided, and the number of photomasks used in the manufacturing process may be further increased in order to perform patterning of additional metal layers.

For example, in Japanese Unexamined Patent Application Publication No. 2004-302475, a metal layer (referred to as a "light shielding metal layer") is added on the substrate side of the active layer of the pixel TFT and a light shielding film of the pixel TFT is provided in the added metal layer. Therefore, a separate photomask is required for patterning the light shielding metal layer, and the number of photomasks used increases.

On the other hand, Japanese Unexamined Patent Application Publication No. 2013-084977 suggests that a lower metal layer is patterned at the same time as a semiconductor film that is an active layer of a pixel TFT. Thereby, the light shielding film can be formed without increasing the number of photomasks. However, since the position and size of the light shielding film cannot be adjusted optionally, it may be difficult to form a light shielding film capable of blocking light traveling toward the active layer by turning around from the substrate side, for example. In addition, since the light shielding metal layer cannot be used for the components other than the light shielding film, the light shielding metal layer cannot be used for adding functions or for high definition of the active matrix substrate, for example. Therefore, it is difficult to suppress an increase in the number of metal layers (that is, an increase in the number of photomasks used) accompanying the addition of functions.

An aspect of the disclosure has been made in consideration of the above circumstances, and an object of one embodiment of the disclosure is to provide a method for manufacturing an active matrix substrate capable of reducing the number of photomasks used. Another object of the disclosure is to provide an active matrix substrate that can be manufactured by reducing the number of photomasks used.

The present specification discloses an active matrix substrate and a method for manufacturing an active matrix substrate described in the following items.

[Item 1]

There is provided a method for manufacturing an active matrix substrate including at least one first formation region in which a first substructure is formed, the method including:

(A) a step of forming a laminated film including a lower conductive film, a lower insulating film, and a semiconductor film in this order on a substrate;

(B) a step of forming a first resist layer including a first region and a second region thinner than the first region by forming a resist film on the laminated film and exposing and developing the resist film using a multi-tone photomask, the first resist layer including the first region and the second region arranged in contact with at least a portion of a peripheral edge of the first region in the at least one first formation region;

(C) a step of performing a patterning on the laminated film, including:
- a step (c1) of performing a first patterning on the lower conductive film, the lower insulating film, and the semiconductor film in the laminated film using the first resist layer as a mask to obtain a laminated body;
- a step (c2) of, after the step (c1), ashing the first resist layer and removing the second region of the first resist layer to obtain a second resist layer; and
- a step (c3) of performing a second patterning on the semiconductor film and the lower insulating film in the laminated body using the second resist layer as a mask, the step including exposing the lower conductive film by removing a portion which is not covered with the second resist layer in the semiconductor film and the lower insulating film of the laminated body, thereby, in the at least one first formation region, the first substructure including a first lower conductive layer, a first lower insulating layer, and a first semiconductor layer respectively formed from the lower conductive film, the lower insulating film, and the semiconductor film, aligning a side surface of the first semiconductor layer and a side surface of the first lower insulating layer with each other, overlapping the entire first lower insulating layer and the entire the first semiconductor layer with the first lower conductive layer when viewed from a normal direction of the substrate, and causing an upper surface of the first lower conductive layer to have a protruding portion located outside a peripheral edge of the first semiconductor layer, the protruding portion having a width defined by a width of the second region of the first resist layer; and (D) a step of forming a source electrode and a drain electrode electrically connected to the first semiconductor layer in the first substructure, thereby obtaining a semiconductor element having the first semiconductor layer as an active layer and the first lower conductive layer as a light shielding layer or a lower gate electrode.

[Item 2]

In the method according to Item 1, the active matrix substrate further includes at least one second formation region in which a second substructure is formed, and the at least one second formation region is arranged so as not to be overlapped with the at least one first formation region, in the step (B), in the at least one second formation region, the first resist layer includes the first region and does not include the second region; and in the step (C), in the at least one second formation region, the second substructure is formed that includes a second lower conductive layer, a second lower insulating layer, and a second semiconductor layer respectively formed from the lower conductive film, the lower insulating film, and the semiconductor film, and in the second substructure, a side surface of the second lower conductive layer, a side surface of the second semiconductor layer, and a side surface of the second lower insulating layer are aligned with each other.

[Item 3]

In the method according to Item 1 or 2, wherein the active matrix substrate further includes at least one third formation region in which a third substructure is formed, and the at least one third formation region is arranged so as not to be overlapped with the at least one first formation region, in the step (B), in the at least one third formation region, the first resist layer includes the second region and does not include the first region, and in the step (C), in the at least one third formation region, the semiconductor film and the lower insulating film are removed, and the third substructure is formed that includes a third lower conductive layer formed from the lower conductive film.

[Item 4]

There is provided a method for manufacturing an active matrix substrate including at least one first formation region in which a first substructure is formed, at least one second formation region in which a second substructure is formed, and at least one third formation region in which a third substructure is formed, the at least one first formation region, the at least one second formation region, and the at least one third formation region not being overlapped with each other, the method including:

(A) a step of forming a laminated film including a lower conductive film, a lower insulating film, and a semiconductor film in this order on a substrate;

(B) a step of forming a first resist layer including a first region and a second region thinner than the first region by forming a resist film on the laminated film and exposing and developing the resist film using a multi-tone photomask, the first resist layer including the first region and the second region arranged in contact with at least a portion of a peripheral edge of the first region in the at least one first formation region, including the first region and not including the second region in the at least one second formation region, and including the second region and not including the first region in the at least one third formation region;

(C) a step of performing a patterning on the laminated film, including:

a step (c1) of performing a first patterning on the lower conductive film, the lower insulating film, and the semiconductor film in the laminated film using the first resist layer as a mask to form a laminated body in each of the at least one first formation region, the at least one second formation region, and the at least one third formation region;

a step (c2) of, after the step (c1), ashing the first resist layer and removing the second region of the first resist layer to obtain a second resist layer; and a step (c3) of performing a second patterning on the semiconductor film and the lower insulating film in the laminated body using the second resist layer as a mask, the step including exposing the lower conductive film by removing a portion which is not covered with the second resist layer in the semiconductor film and the lower insulating film of the laminated body, thereby, in the at least one first formation region, forming the first substructure including a first lower conductive layer, a first lower insulating layer, and a first semiconductor layer respectively formed from the lower conductive film, the lower insulating film, and the semiconductor film, aligning a side surface of the first semiconductor layer and a side surface of the first lower insulating layer with each other, overlapping the entire first lower insulating layer and the entire the first semiconductor layer with the first lower conductive layer when viewed from a normal direction of the substrate, and causing an upper surface of the first lower conductive layer to have a protruding portion located outside a peripheral edge of the first semiconductor layer, the protruding portion having a width defined by a width of the second region of the first resist layer, in the at least one second formation region, forming a second substructure including a second lower conductive layer, a second lower insulating layer, and a second semiconductor layer respectively formed from the lower conductive film, the lower insulating film, and the semiconductor film, and in the second substructure, aligning a side surface of the second lower conductive layer, a side surface of the second semiconductor layer, and a side surface of the second lower insulating layer with each other, and in the at least one third formation region, removing the semiconductor film and the lower insulating film, and forming the third substructure including a third lower conductive layer formed from the lower conductive film; and (D) a step of forming a semiconductor element having the first semiconductor layer in the first substructure as an active layer, and/or forming a semiconductor element having the second semiconductor layer in the second substructure as an active layer in the at least one second formation region.

[Item 5]

In the method according to any one of Items 1 to 4, the semiconductor element is a TFT or a TFT type diode.

[Item 6]

The method according to any one of Items 3 to 5 further includes a step of forming a wiring using the third substructure.

[Item 7]

The method according to Item 4 further includes a step of forming a reflective structure on the substrate by forming a convex-concave structure using at least one of the first substructure, the second substructure, and the third substructure, and covering the convex-concave structure with a metal layer.

[Item 8]

There is provided an active matrix substrate having a display region including a plurality of pixel regions and a non-display region other than the display region, the active matrix substrate including:

a substrate; a plurality of first substructures supported by the substrate; and a plurality of semiconductor elements supported by the substrate.

Each of the plurality of first substructures has a structure in which a first lower conductive layer, a first lower insulating layer, and a first semiconductor layer are stacked in this order from a side closest to the substrate, a side surface of the first semiconductor layer and a side surface of the first lower insulating layer are aligned with each other, the entire first lower insulating layer and the entire first semiconductor layer are overlapped with the first lower conductive layer when viewed from a normal direction of the substrate, and an upper surface of the first lower conductive layer has a protruding portion located outside a peripheral edge of the first semiconductor layer.

Each of the plurality of semiconductor elements includes one of the plurality of first substructures, and a first source electrode and a first drain electrode electrically connected to the first semiconductor layer in the one first substructure.

[Item 9]

In the active matrix substrate according to Item 8, in each of the plurality of semiconductor elements, the protruding portion of the upper surface of the first lower conductive layer in the one first substructure is arranged so as to surround the first semiconductor layer when viewed from the normal direction of the substrate.

[Item 10]

In the active matrix substrate according to Item 8, in each of the plurality of semiconductor elements, the protruding portion of the upper surface of the first lower conductive layer in the one first substructure is arranged along only a portion of the peripheral edge of the first semiconductor layer when viewed from the normal direction of the substrate, and a peripheral edge of a portion of the first lower conductive layer other than the protruding portion is aligned with the peripheral edges of the first semiconductor layer and the first lower insulating layer.

[Item 11]

The active matrix substrate according to any one of Items 8 to 10 further includes a plurality of second substructures supported by the substrate.

Each of the plurality of second substructures has a structure in which a second lower conductive layer, a second lower insulating layer, and a second semiconductor layer are stacked in this order from the side closest to substrate, the second lower conductive layer is formed of the same lower conductive film as the first lower conductive layer, the second lower insulating layer is formed of the same lower insulating film as the first lower insulating layer, and the second semiconductor layer is formed of the same semiconductor film as the first semiconductor layer, and a side surface of the second lower conductive layer, a side surface of the second lower insulating layer, and a side surface of the second semiconductor layer are aligned with each other.

[Item 12]

The active matrix substrate according to any one of Items 8 to 11 further includes a plurality of third substructures supported by the substrate.

Each of the plurality of third substructures includes a third lower conductive layer formed of the same lower conductive film as the first lower conductive layer, and neither an insulating layer formed of the same lower insulating film as the first lower insulating layer, nor a semiconductor layer formed of the same semiconductor film as the first semiconductor layer is arranged on the third lower conductive layer.

[Item 13]

In the active matrix substrate according to any one of Items 8 to 12, the plurality of semiconductor elements include a pixel TFT arranged in each of the plurality of pixel regions, the pixel TFT includes a gate insulating layer covering the one first substructure, and a first gate electrode disposed on the gate insulating layer, and in the pixel TFT, the gate insulating layer covers a side surface of the first lower conductive layer, a side surface of the first lower insulating layer, and a side surface and an upper surface of the first semiconductor layer, and the first gate electrode is at least partially overlapped with the first semiconductor layer when viewed from the normal direction of the substrate.

[Item 14]

In the active matrix substrate according to any one of Items 8 to 13, the plurality of semiconductor elements include a plurality of TFT type diodes arranged in the non-display region, and in each of the plurality of TFT type diodes, the first lower conductive layer functions as a gate, and the first source electrode is connected to the protruding portion of the first lower conductive layer.

[Item 15]

In the active matrix substrate according to Item 14, each of the plurality of TFT type diodes includes a conductive layer disposed above the first semiconductor layer in the one first substructure via an insulating layer, and the conductive layer is in an electrically floating state.

[Item 16]

The active matrix substrate according to Item 11 further includes a plurality of other semiconductor elements supported by the substrate.

Each of the plurality of other semiconductor elements includes one of the plurality of second substructures, and a second source electrode and a second drain electrode electrically connected to the second semiconductor layer in the one second substructure.

[Item 17]

In the active matrix substrate according to Item 11 or 16, the plurality of other semiconductor elements include at least one circuit TFT arranged in the non-display region.

[Item 18]

The active matrix substrate according to any one of Items 8 to 17 further includes a reflective structure arranged in each of the plurality of pixel regions.

The reflective structure has a convex-concave structure including at least one of the plurality of first substructures, and a metal layer covering the convex-concave structure.

[Item 19]

The active matrix substrate according to Item 11 further includes a reflective structure arranged in each of the plurality of pixel regions.

The reflective structure has a convex-concave structure including at least one of the plurality of second substructures, and a metal layer covering the convex-concave structure.

[Item 20]

The active matrix substrate according to Item 12 further includes a reflective structure arranged in each of the plurality of pixel regions.

The reflective structure includes at least one of the plurality of third substructures.

[Item 21]

The active matrix substrate according to Item 12 further includes at least one wiring including one of the plurality of third substructures.

The at least one wiring has a laminated structure including the third lower conductive layer in the one third substructure, an intermediate insulating layer disposed on a portion of an upper surface of the third lower conductive layer, and an upper conductive layer that covers the intermediate insulating layer and is in contact with another portion of the upper surface of the third lower conductive layer, and in a widthwise cross-section of the at least one wiring, the upper conductive layer covers a side surface and an upper surface of the intermediate insulating layer, and is in contact with the upper surface of the third lower conductive layer on both sides of the intermediate insulating layer.

[Item 22]

The active matrix substrate according to Item 12 further includes at least one wiring including one of the plurality of third substructures.

The at least one wiring has a redundant structure including the third lower conductive layer in the one third substructure, an intermediate conductive layer disposed above the third lower conductive layer via an insulating layer in the one third substructure, and an upper conductive layer disposed above the intermediate conductive layer via an interlayer insulating layer.

The intermediate conductive layer is formed of the same conductive film as a gate electrode of the semiconductor element, and the upper conductive layer is formed of the same conductive film as the first source electrode.

[Item 23]

In the active matrix substrate according to Item 22, in the at least one wiring, one or two of the third lower conductive layer, the intermediate conductive layer, and the upper conductive layer are used as an auxiliary wiring and the rest is used as a main wiring.

According to the embodiment of the disclosure, there is provided a method for manufacturing an active matrix substrate capable of reducing the number of photomasks used. Further, there is provided an active matrix substrate that can be manufactured by reducing the number of photomasks used.

DETAILED DESCRIPTION

First Embodiment

Hereinafter, an active matrix substrate according to a first embodiment will be described with reference to the drawings.

Figure 1:
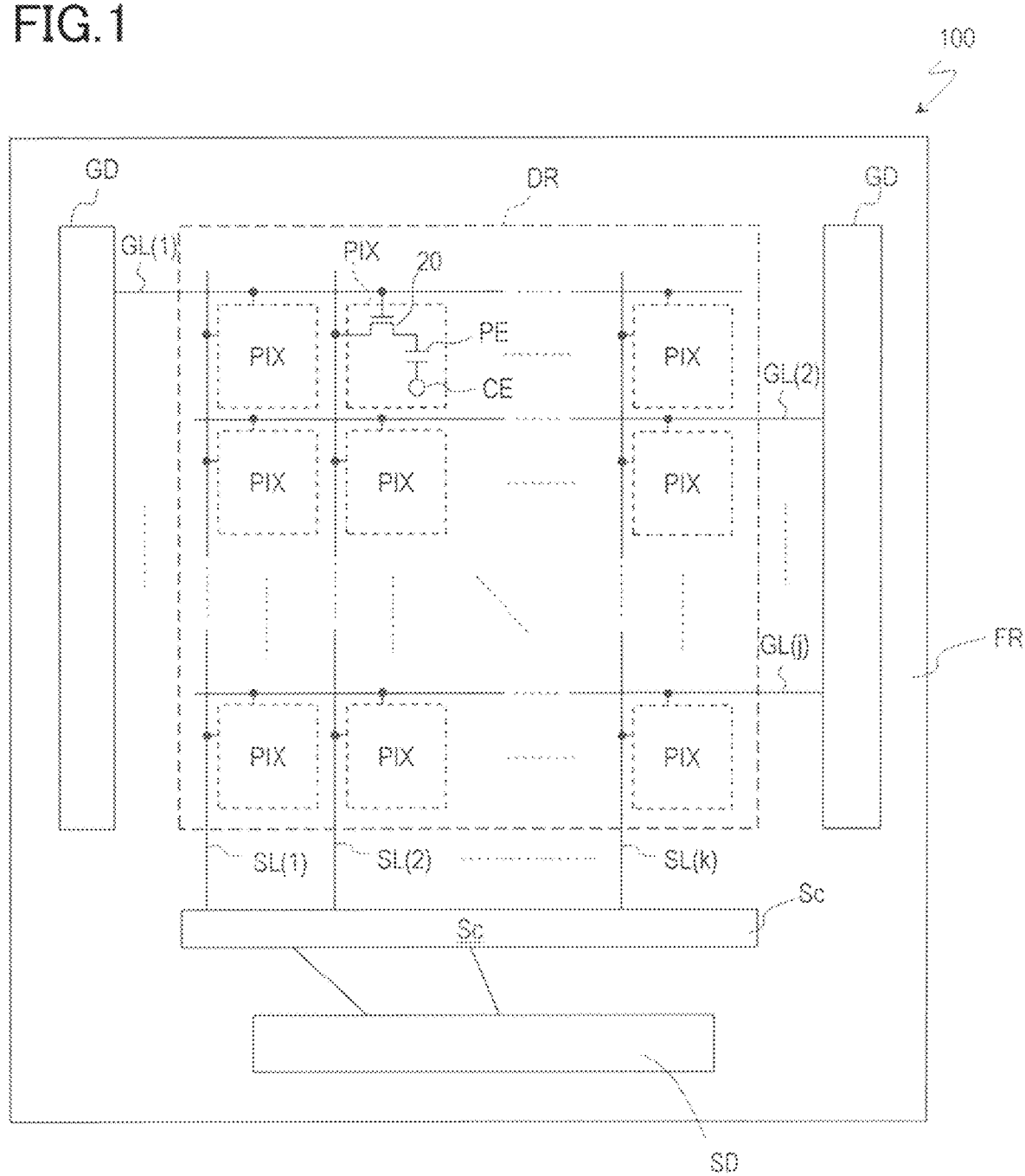
FIG. 1 is a diagram schematically showing an example of a planar structure of an active matrix substrate 100 according to an embodiment of the disclosure.

FIG. 1 is a diagram schematically showing an example of a planar structure of an active matrix substrate 100. The active matrix substrate 100 has a display region DR that contributes to display and a peripheral region (frame region) FR located outside the display region DR. The display region DR includes a plurality of pixel regions PIX arranged in a matrix. The pixel region PIX (sometimes referred to simply as a "pixel") is a region corresponding to a pixel of a display device. The non-display region FR is a region that is located around the display region DR and does not contribute to the display.

In the display region DR, the active matrix substrate 100 includes a plurality of pixel TFTs 20 supported by the substrate, a plurality of pixel electrodes PE, a plurality of gate bus lines GL(1) to GL(j) for supplying a gate signal to the pixel TFT 20 (j is an integer of 2 or more, hereinafter collectively referred to as a "gate bus line GL"), and a plurality of source bus lines SL(1) to SL(k) for supplying a source signal to the pixel TFT 20 (k is an integer of 2 or more, hereinafter collectively referred to as a "source bus line SL"). Each pixel region PIX is defined by, for example, the gate bus line GL and the source bus line SL. The source bus line SL extends in a direction intersecting with the gate bus line GL.

Each pixel TFT 20 and each pixel electrode PE is provided corresponding to one of the plurality of pixel regions PIX.

A gate electrode of the pixel TFT 20 is electrically connected to one of the gate bus lines GL, and a source electrode thereof is electrically connected to one of the source bus lines SL. A drain electrode is electrically connected to the pixel electrode PE.

When the active matrix substrate 100 is applied to a display device in a lateral electric field mode such as a fringe field switching (FFS) mode, the active matrix substrate 100 is provided with a common electrode CE for the plurality of pixels PIX.

Peripheral circuits such as a driver may be provided in the non-display region FR. For example, a gate driver GD that drives the gate bus line GL, an SSD circuit Sc that drives the source bus line SL in a time division manner, and the like may be monolithically formed. The SSD circuit Sc is connected to a source driver SD mounted by, for example, a chip on glass (COG) method.

<Pixel Region PIX>

Next, with reference to the drawings, the structure of the pixel region PIX of the active matrix substrate according to the present embodiment will be described by taking the active matrix substrate applied to the display device in the FFS mode as an example. The FFS mode is a lateral electric field mode in which a pair of electrodes is provided on one substrate and an electric field is applied to liquid crystal molecules in a direction parallel to the substrate surface (lateral direction).

Figure 2A:
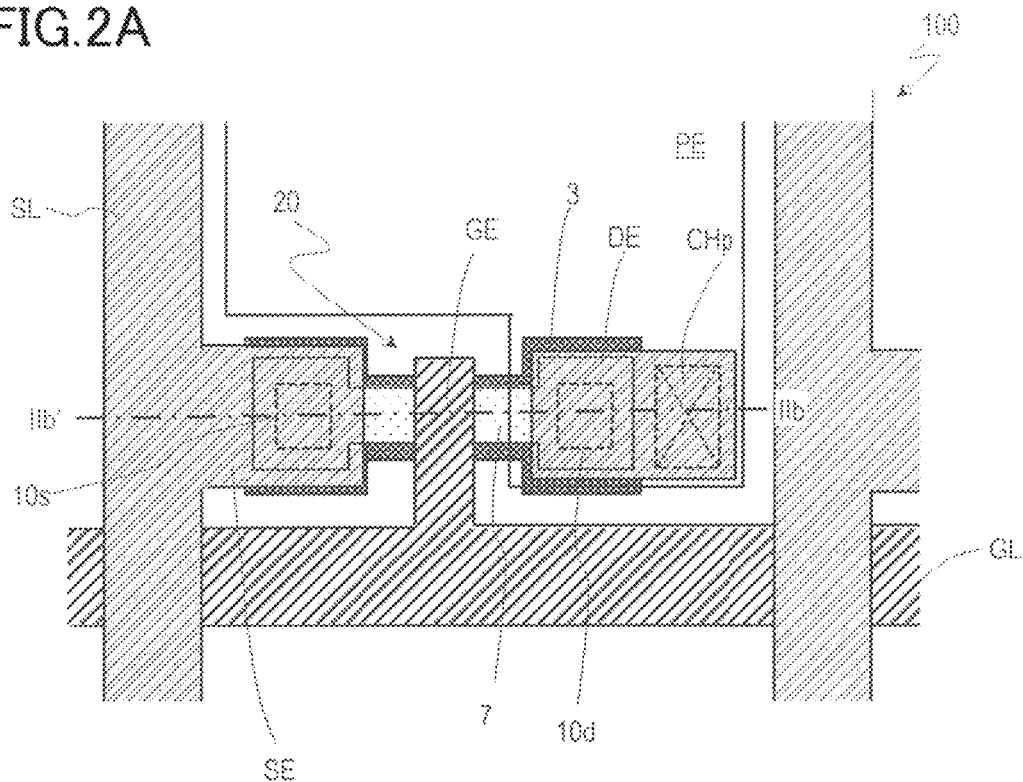
FIG. 2A is a plan view illustrating each pixel region PIX in the active matrix substrate 100.
Figure 2B:
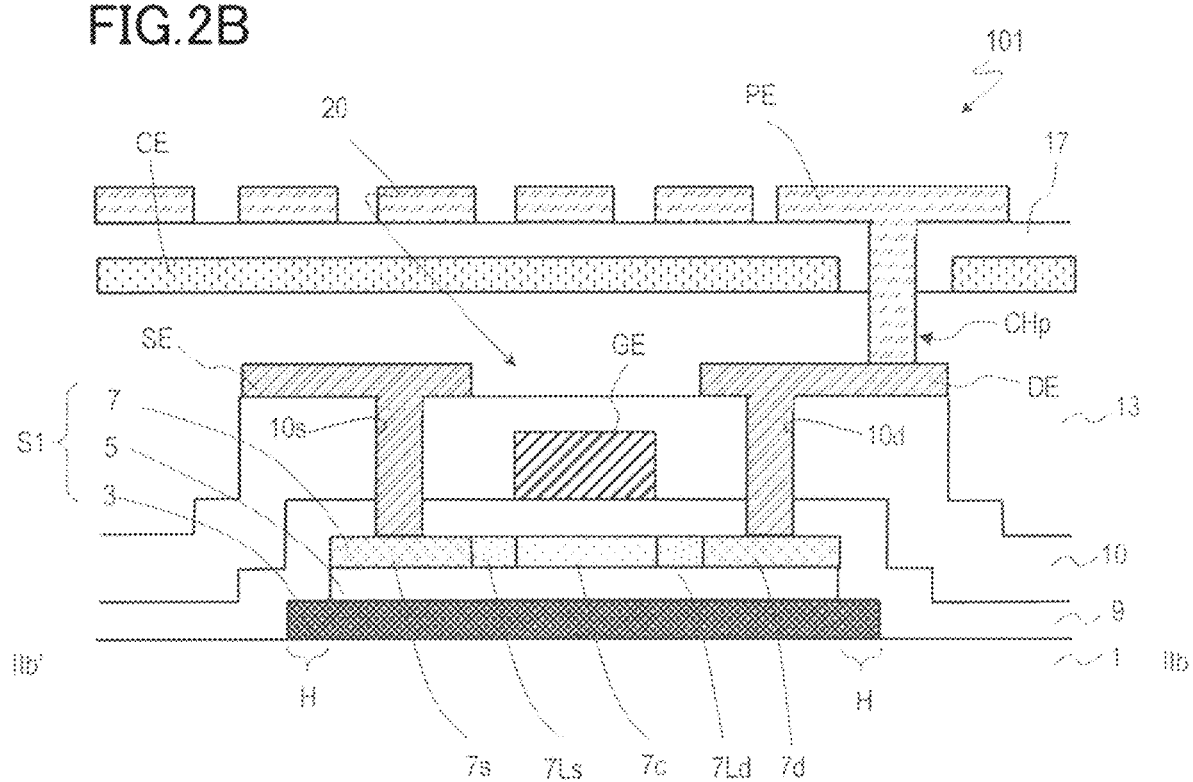
FIG. 2B is a cross-sectional view taken along line IIb-IIb' that crosses a TFT 20 in the pixel region PIX.

FIG. 2A is a plan view illustrating a portion of each pixel region PIX in the active matrix substrate 100, and FIG. 2B is a cross-sectional view taken along line IIb-IIb' that crosses the TFT 20 in the pixel region PIX.

The active matrix substrate 100 has a substrate 1 and the plurality of source bus lines SL and the plurality of gate bus lines GL supported on the main surface of the substrate 1. Each pixel region PIX is defined by one source bus line SL and one gate bus line GL. Each pixel region PIX has the TFT 20 having a top gate structure, the pixel electrode PE, and the common electrode CE. In this example, the TFT 20 is an n-channel type crystalline silicon TFT.

The TFT 20 has a structure (hereinafter, referred to as a "first substructure") S1 in which a lower conductive layer 3, a lower insulating layer 5, and a semiconductor layer 7 are stacked in this order on the substrate 1, a gate insulating layer 9 covering the first substructure S1, a gate electrode GE disposed on the gate insulating layer 9, a source electrode SE, and a drain electrode DE. The gate electrode GE is arranged so as to overlap at least a portion (here, a channel region) 7c of the semiconductor layer 7 with the gate insulating layer 9 therebetween. The lower conductive layer 3 functions as a light shielding layer that blocks light (backlight light) traveling from the substrate 1 side toward the semiconductor layer 7.

In the first substructure S1, the side surface of the semiconductor layer 7 and the side surface of the lower insulating layer 5 are aligned with each other. Further, when viewed from the normal direction of the substrate 1, the entire lower insulating layer 5 and the entire semiconductor layer 7 overlap the lower conductive layer 3, and the upper surface of the lower conductive layer 3 has protruding portions H located outside peripheral edges of the semiconductor layer 7 and the lower insulating layer 5.

In this example, the entire lower insulating layer 5 and the entire semiconductor layer 7 are located inside the peripheral edge of the lower conductive layer 3 when viewed from the normal direction of the substrate 1. That is, when viewed from the normal direction of the substrate 1, the protruding portions H of the lower conductive layer 3 are arranged so as to surround the semiconductor layer 7. For example, the lower conductive layer 3 may have a pattern that is slightly larger than the semiconductor layer 7 and the lower insulating layer 5. Although not shown, the side surface of each layer forming the first substructure S1 may have a tapered shape.

The gate insulating layer 9 is arranged so as to cover the lower conductive layer 3, the lower insulating layer 5, and the semiconductor layer 7. The gate insulating layer 9 may be arranged so as to cover the side surface of the lower conductive layer 3, the side surface of the lower insulating layer 5, and the side surface and the upper surface of the semiconductor layer 7 (here in direct contact).

The gate electrode GE is disposed on a portion of the gate insulating layer 9. The portion 7c of the semiconductor layer 7 that overlaps the gate electrode GE when viewed from the normal direction of the main surface of the substrate 1 is referred to as a "channel region".

The semiconductor layer 7 has the channel region 7c that overlaps the gate electrode GE and a source region 7s and a drain region 7d that are located on both sides of the channel region 7c when viewed from the normal direction of the main surface of the substrate 1. The source region 7s is electrically connected to the corresponding source bus line SL via the source electrode SE. The drain region 7d is electrically connected to the pixel electrode PE via the drain electrode DE. The source region 7s and the drain region 7d are low-resistivity regions having a resistivity lower than that of the channel region 7c.

In this example, the semiconductor layer 7 is a crystalline silicon layer such as a polycrystalline silicon layer. The source region 7s and the drain region 7d are high concentration impurity regions containing impurities (for example, n-type impurities) at a high concentration. The semiconductor layer 7 may have a low concentration impurity region (lightly doped drain, hereinafter sometimes abbreviated as a "LDD region") containing an impurity (for example, an n-type impurity) at a concentration lower than those of the source region 7s and the drain region 7d at at least one of a portion between the channel region 7c and the source region 7s and a portion between the channel region 7c and the drain region 7d. In the shown example, the semiconductor layer 7 has a first LDD region 7Ls between the channel region 7c and the source region 7s, and a second LDD region 7Ld between the channel region 7c and the drain region 7d. The channel region 7c may not substantially contain impurities, or may contain impurities for adjusting a threshold voltage of the TFT 20.

The gate insulating layer 9 and the gate electrode GE are covered with an interlayer insulating layer 10. In the interlayer insulating layer 10 and the gate insulating layer 9, a source opening 10s exposing a portion of the source region 7s and a drain opening 10d exposing a portion of the drain region 7d are formed.

The source electrode SE is formed on the interlayer insulating layer 10 and in the source opening 10s, and is connected to the source region 7s of the semiconductor layer 7 in the source opening 10s. The drain electrode DE is formed on the interlayer insulating layer 10 and in the drain opening 10d, and is connected to the drain region 7d of the semiconductor layer 7 in the drain opening 10d.

The lower conductive layer 3 may be in an electrically floating state or may be fixed at a fixed potential (for example, a source potential). Alternatively, it may be electrically connected to the gate electrode GE (or the corresponding gate bus line GL) and function as the lower gate electrode of the TFT 20.

An upper insulating layer 13 may be formed on the interlayer insulating layer 10, the source electrode SE, and the drain electrode DE so as to cover the TFT 20. Although not shown, the upper insulating layer 13 may have a laminated structure including an inorganic insulating layer (passivation film) and an organic insulating layer formed on the inorganic insulating layer. The organic insulating layer may be formed only in the display region.

The common electrode CE is formed on the upper insulating layer 13. The common electrode CE does not have to be separated for each pixel region PIX. For example, the common electrode CE may have an opening in a region where a pixel contact hole CHp is formed (pixel contact region), and may be formed over the entire pixel region PIX except for the pixel contact region.

The pixel electrode PE is disposed above the common electrode CE via a dielectric layer 17. The pixel electrode PE is separated for each pixel region PIX. In each pixel region PIX, the pixel electrode PE is provided with one or a plurality of slits (openings) or cutouts. The pixel electrode PE is disposed on the dielectric layer 17 and is connected to the drain region 7d of the semiconductor layer 7 in the pixel contact hole CHp formed in the upper insulating layer 13 and the dielectric layer 17.

In the shown example, the pixel electrode PE is formed above the common electrode CE via the dielectric layer 17, but the common electrode CE may be formed above the pixel electrode PE via the dielectric layer 17.

In the present specification, a layer including an electrode/wiring formed using the same conductive film (lower conductive film) as the lower conductive layer 3 is referred to as a "lower metal layer", a layer including an electrode/wiring formed using the same conductive film (gate conductive film) as the gate bus line GL is referred to as a "gate metal layer", and a layer including an electrode/wiring formed using the same conductive film (source conductive film) as the source bus line SL is referred to as a "source metal layer".

The gate electrode GE may be formed in the gate metal layer (using the gate conductive film). The gate electrode GE may be formed integrally with (may be connected to) the gate bus line GL. For example, the gate electrode GE may be a portion of the gate bus line GL. In this case, a portion of the gate bus line GL that overlaps the semiconductor layer 7 when viewed from the normal direction of the substrate 1 may be referred to as the "gate electrode GE". Alternatively, when viewed from the normal direction of the substrate 1, the gate electrode GE may be formed in an extended portion or a protrusion (branch portion) extending from a portion of the side surface of the gate bus line GL in a direction different from the gate bus line GL.

The source electrode SE and the drain electrode DE may be formed in the source metal layer (using the source conductive film). The source electrode SE may be formed integrally with (may be connected to) the source bus line SL. For example, the source electrode SE may be a portion of the source bus line SL. In this case, the portion of the source bus line SL that is connected to the semiconductor layer 7 may be referred to as the "source electrode SE". Alternatively, when viewed from the normal direction of the substrate 1, the source electrode SE may be formed in an extended portion or a protrusion (branch portion) extending from a portion of the side surface of the source bus line SL extending in a second direction in the other direction.

The structure of the TFT 20 is not limited to the shown structure. The semiconductor layer 7 of the TFT 20 may not have the LDD region. Alternatively, when viewed from the normal direction of the substrate 1, the TFT 20 may have a GOLD structure arranged so that a portion or the whole of the LDD region overlaps the gate electrode.

The TFT 20 in the present embodiment has a first substructure S1 composed of the lower conductive layer 3, the lower insulating layer 5, and the semiconductor layer 7. In the first substructure S1, the lower conductive layer 3 is disposed on the substrate 1 side of the semiconductor layer 7 so as to cover the entire semiconductor layer 7 and the surrounding region when viewed from the normal direction of the substrate 1. Therefore, the lower conductive layer 3 can block not only light directly traveling from the substrate 1 side toward the semiconductor layer 7 but also light traveling toward the semiconductor layer 7 by turning around from the substrate, so that deterioration of the characteristics of the semiconductor layer 7 can be effectively suppressed.

Further, in the active matrix substrate in the related art, the insulating layer (lower insulating layer) covering the light shielding film is usually formed over almost the entire pixel region. Therefore, there is a problem that visible light transmittance in the pixel region is attenuated by the lower insulating layer. In contrast, in the present embodiment, the lower insulating layer 5 is located only in the portion located between the semiconductor layer 7 and the lower conductive layer 3, and is removed from other portions in the pixel region. Accordingly, the visible light transmittance in the pixel region can be increased as compared with the case in the related art.

Although the pixel TFT including the first substructure S1 has been described above, the active matrix substrate according to the present embodiment may include another semiconductor element using the first substructure S1 in addition to the pixel TFT or instead of the pixel TFT. The other semiconductor element may be a circuit TFT constituting a peripheral circuit or a diode used for a protection circuit such as a diode ring.

<Method for Forming First Substructure S1>

In the present embodiment, the first substructure S1 including the semiconductor layer 7, the lower insulating layer 5, and the lower conductive layer 3 is formed using the same photomask (multi-tone photomask such as a halftone mask). Therefore, misalignment between the semiconductor layer 7 and the lower conductive layer 3 does not occur, and the lower conductive layer 3 is arranged so as to reliably overlap the entire semiconductor layer 7. Further, the shape of the lower conductive layer 3 can be made larger than that of the semiconductor layer 7. Accordingly, the entire semiconductor layer 7 can be blocked more reliably and uniformly, and deterioration of the characteristics of the semiconductor layer 7 due to light (backlight light) from the substrate 1 side can be more effectively suppressed.

FIGS. 3A to 3E are process cross-sectional views for describing an example of a method for manufacturing a first substructure S1.

Figure 3A:
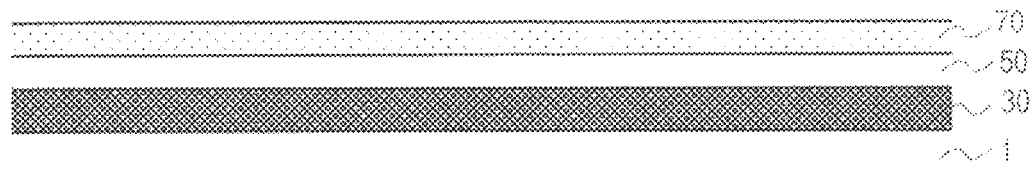
FIG. 3A is a process cross-sectional view for describing an example of a method for manufacturing a first substructure S1.

First, as shown in FIG. 3A, a lower conductive film 30, a lower insulating film 50, and a semiconductor film 70 are formed in this order on the substrate 1. The semiconductor film 70 may be a crystalline silicon semiconductor film such as a polycrystalline silicon film.

For example, the lower conductive film 30, the lower insulating film 50, and the amorphous silicon semiconductor film may be continuously formed by a chemical vapor deposition (CVD) method, and then the amorphous silicon semiconductor film may be crystallized to form a crystalline silicon semiconductor film.

Figure 3B:
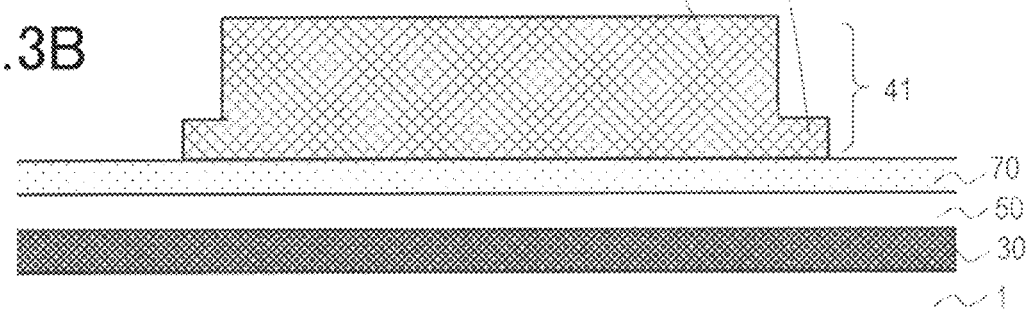
FIG. 3B is a process cross-sectional view for describing an example of the method for manufacturing the first substructure S1.

Next, a photoresist film is formed on the semiconductor film 70, and the photoresist film is exposed using a multi-tone photomask (here, a halftone mask). When a halftone mask is used, in a single exposure process, a region exposed with three mutually different exposure amounts (a minimum value, a maximum value, and an intermediate value between these values) is formed. By developing this, as shown in FIG. 3B, a first resist layer 41 including a first region 41a and a second region 41b thinner than the first region 41a is formed on the semiconductor film 70.

The region where the exposure amount is an intermediate value is defined by the halftone mask. When the photoresist film is formed using a negative type photoresist, the region where having the maximum exposure amount becomes the first region 41a, the region having the intermediate exposure amount becomes the second region 41b, and an opening is formed in the region having the minimum exposure amount. When a positive type photoresist is used, the region having the minimum exposure amount becomes the first region 41a, the region having the intermediate exposure amount becomes the second region 41b, and an opening is formed in the region having the maximum exposure amount.

In the present embodiment, when viewed from the normal direction of the substrate 1, in the region where the TFT 20 is formed, the second region 41b of the first resist layer 41 is arranged so as to be in contact with the peripheral edge of the island-shaped first region 41a and surround the island-shaped first region 41a. The first region 41a defines the pattern of the semiconductor layer and the first insulating layer, and the first region 41a and the second region 41b define the pattern of the lower conductive layer. The second region 41b defines the position and width of the protruding portion of the lower conductive layer. The arrangement of the second region 41b is not limited to the above, and the second region 41b may be disposed on at least a portion of the peripheral edge of the first region 41a.

Figure 3C:
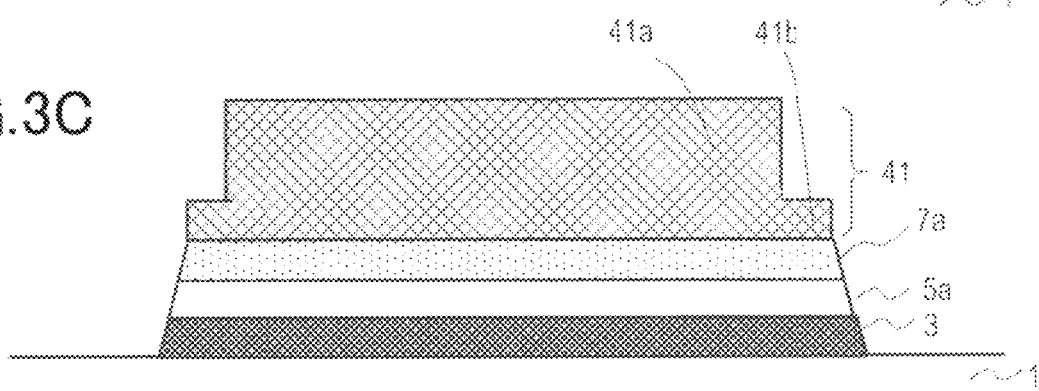
FIG. 3C is a process cross-sectional view for describing an example of the method for manufacturing the first substructure S1.

Subsequently, using the first resist layer 41 as a mask, the semiconductor film 70, the lower insulating film 50, and the lower conductive film 30 are patterned (first patterning). For example, dry etching may be performed using a mixed gas of carbon tetrafluoride and oxygen. Thereby, as shown in FIG. 3C, a laminated body including a semiconductor layer 7a, a lower insulating layer 5a, and the lower conductive layer 3 is obtained. When viewed from the normal direction of the substrate 1, the peripheral edges of the semiconductor layer 7a, the lower insulating layer 5a, and the lower conductive layer 3 are substantially aligned with each other.

Figure 3D:
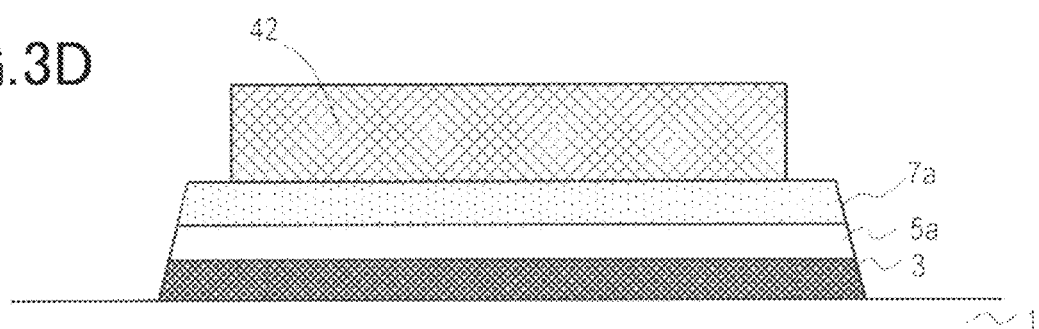
FIG. 3D is a process cross-sectional view for describing an example of the method for manufacturing the first substructure S1.

Thereafter, as shown in FIG. 3D, the thickness of the first resist layer 41 is reduced by performing an ashing process on the first resist layer 41. Thereby, the thin second region 41b of the first resist layer 41 is removed. In this way, a second resist layer 42 is obtained.

Figure 3E:
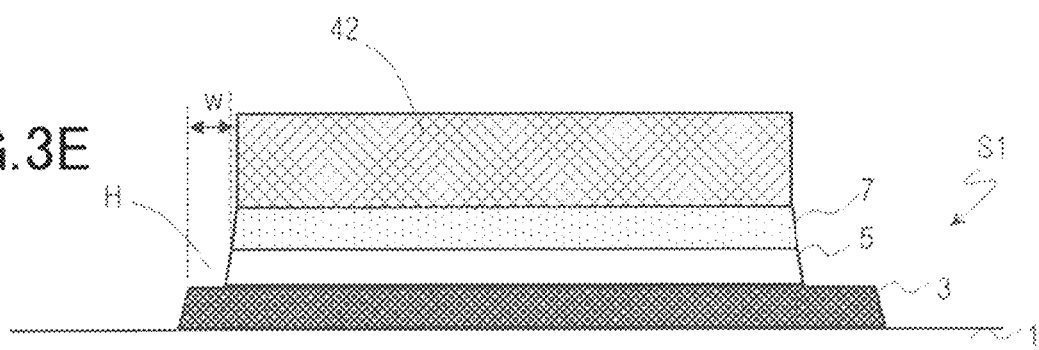
FIG. 3E is a process cross-sectional view for describing an example of the method for manufacturing the first substructure S1.

Next, as shown in FIG. 3E, by using the second resist layer 42 (that is, the first resist layer 41 after the ashing process), the semiconductor layer 7a and the lower insulating layer 5a are patterned (second patterning). Here, the portions of the semiconductor layer 7a and the lower insulating layer 5a which are not covered with the second resist layer 42 are removed by dry etching to expose the lower conductive layer 3 thereunder. The etching gas may be the same as above. Note that the lower conductive layer 3 is not removed by etching in the second patterning. However, a surface portion of the portion of the lower conductive layer 3 which is not covered with the second resist layer 42 is etched in some cases.

By second etching, the semiconductor layer 7 is obtained from the semiconductor layer 7a, and the lower insulating layer 5 is obtained from the lower insulating layer 5a. The side surface of the semiconductor layer 7 and the side surface of the lower insulating layer 5 are substantially aligned with each other. In other words, when viewed from the normal direction of the substrate 1, the peripheral edges of the semiconductor layer 7 and the lower insulating layer 5 are substantially aligned with each other. The configuration in which "the side surface of the semiconductor layer 7 and the side surface of the lower insulating layer 5 are substantially aligned with each other" can be obtained by forming these layers by etching using the same mask. As shown in the figure, the side surface of each layer may have a tapered shape.

When viewed from the normal direction of the substrate 1, the peripheral edges of the semiconductor layer 7 and the lower insulating layer 5 are located inside the lower conductive layer 3. Further, when viewed from the normal direction of the substrate 1, the upper surface of the lower conductive layer 3 has the portion (protruding portion) H located outside the peripheral edge of the semiconductor layer 7. A width of the protruding portion H (referred to as a "protrusion width") w can be adjusted by the width of the second region 41b of the first resist layer 41 described above. Thereafter, the second resist layer 42 is removed. In this way, the first substructure S1 including the lower conductive layer 3, the lower insulating layer 5, and the semiconductor layer 7 is formed.

According to the above method, the lower conductive film 30 and the semiconductor film 70 can be patterned using the same photomask (halftone mask). Therefore, the number of photomasks used can be reduced as compared with the case where the lower conductive film 30 and the semiconductor film 70 are patterned in separate photolithography processes. Instead of the halftone mask, another multi-tone mask (gray-tone mask) may be used.

Further, by using the same photomask, the lower conductive layer 3 is arranged so as to overlap the entire semiconductor layer 7 when viewed from the normal direction of the substrate 1 without designing in consideration of alignment accuracy. Therefore, the deterioration of the semiconductor layer 7 due to the backlight light can be more effectively suppressed.

Further, as described above, the width (protrusion width) w of the protruding portion H of the lower conductive layer 3 can be adjusted optionally by the width of the second region 41b of the first resist layer 41. By controlling the protrusion width w of the lower conductive layer 3, it is possible to more effectively suppress the light from the substrate 1 side from entering the semiconductor layer 7 due to turning around while ensuring a pixel aperture ratio. The protrusion width w is not particularly limited, but when it is, for example, 1 µm or more, it is possible to more effectively block the light traveling toward the semiconductor layer 7 by turning around from the substrate. On the other hand, when the protrusion width w is 2 µm or less, preferably 1.5 µm or less, the lowering of the pixel aperture ratio due to the lower conductive layer 3 can be suppressed. Further, since the area of the region where the TFT is formed can be reduced, a higher definition active matrix substrate can be obtained.

The lower conductive layer 3 may be arranged so as to overlap the entire semiconductor layer 7 when viewed from the normal direction of the substrate 1. The width w, the shape, the arrangement, and the like of the protruding portion H of the lower conductive layer 3 can be appropriately changed. For example, in the example shown in FIG. 2A, the protruding portion H of the lower conductive layer 3 is arranged along the entire peripheral edge of the semiconductor layer 7 when viewed from the normal direction of the substrate 1, but may be arranged along only a portion of the peripheral edge of the semiconductor layer 7.

Modification Example

Figure 4A:
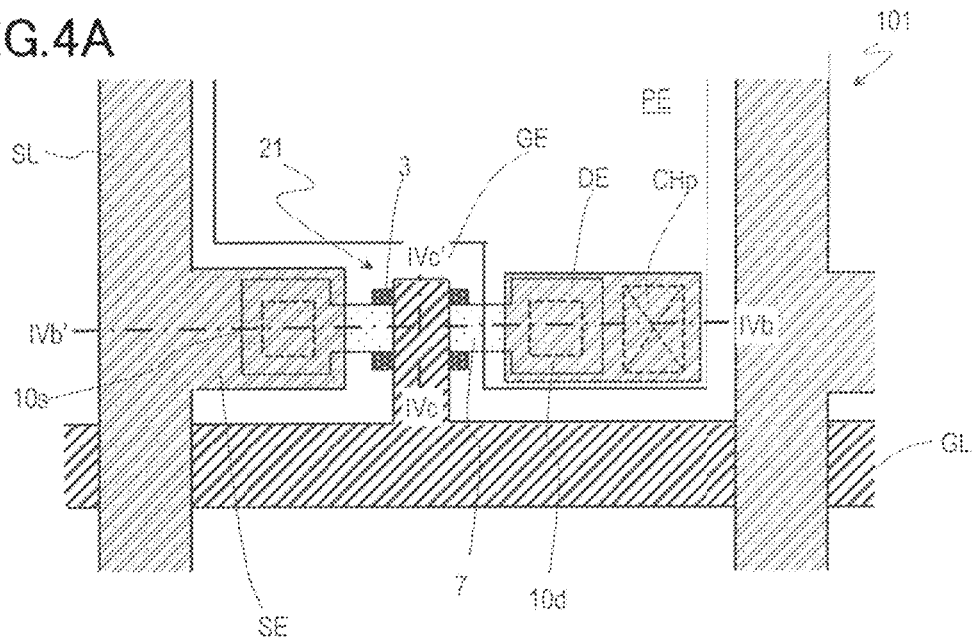
FIG. 4A is a plan view illustrating a portion of a pixel region in an active matrix substrate 101 according to Modification Example 1.
Figure 4B:
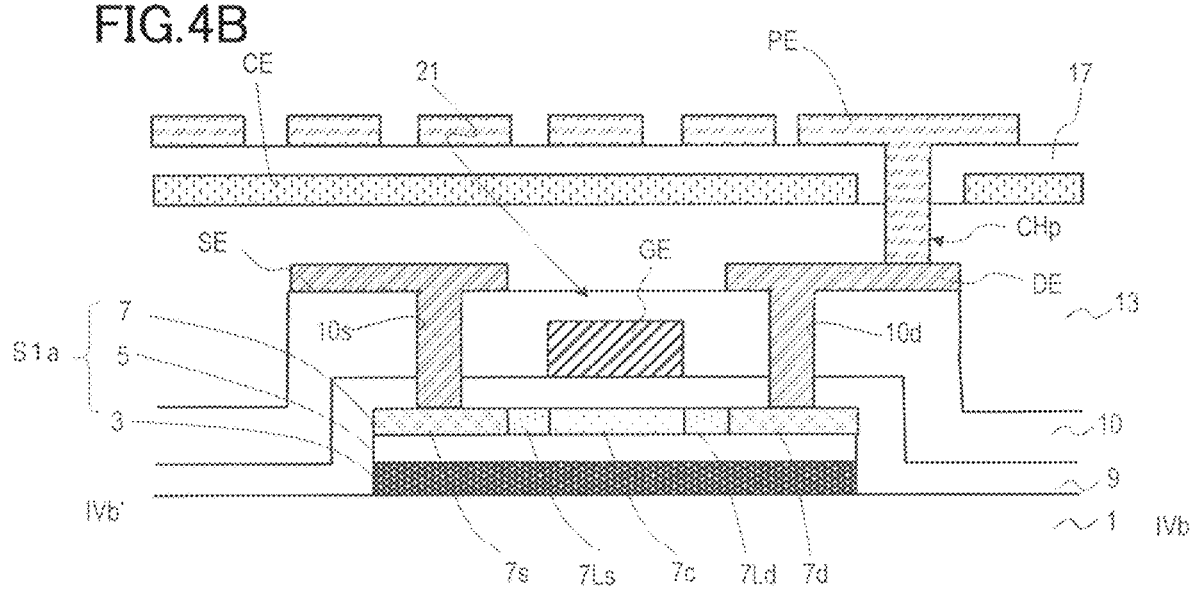
FIG. 4B is a cross-sectional view taken along line IVb-IVb' of the pixel region.
Figure 4C:
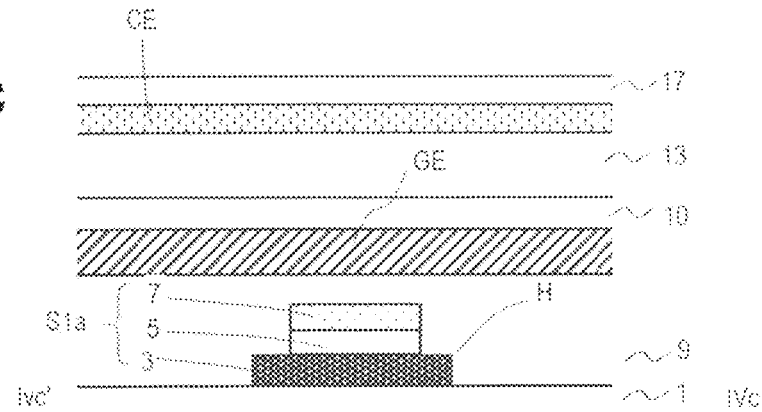
FIG. 4C is a cross-sectional view taken along line IVc-IVc' of the pixel region.

FIG. 4A is a plan view illustrating a portion of a pixel region in an active matrix substrate 101 according to Modification Example 1, and FIGS. 4B and 4C are cross-sectional views taken along line IVb-IVb' and line IVc-IVc' shown in FIG. 4A, respectively.

A TFT 21 is different from the above-mentioned TFT 20 (FIGS. 2A and 2B) in that it has a first substructure Sla in which the protruding portion H is partially arranged.

In the first substructure Sla, the protruding portion H of the lower conductive layer 3 is formed only on a portion of the peripheral edge of the semiconductor layer 7 (here, only the peripheral edge of the channel region 7c) when viewed from the normal direction of the substrate 1. The peripheral edge of the other portion (the portion which does not protrude) of the lower conductive layer 3 is aligned with the peripheral edges of the semiconductor layer 7 and the lower insulating layer 5.

In other words, the side surface of the portion of the lower conductive layer 3 which does not protrude is aligned with the side surface of the semiconductor layer 7 and the side surface of the lower insulating layer 5. Although not shown, the side surface of each layer forming the first substructure Sla may have a tapered shape.

Here, the lower conductive layer 3 has the protruding portion H around the channel region 7c. When viewed from the normal direction of the substrate 1, at least the channel region 7c of the semiconductor layer 7 is located inside the lower conductive layer 3. On the other hand, the peripheral edges of the source region 7s and the drain region 7d of the semiconductor layer 7 are aligned with the peripheral edge of the lower conductive layer 3. According to Modification Example 1, since the area of the lower conductive layer 3 can be made smaller than that of the TFT (FIG. 2A), it is possible to more reliably block the light traveling toward the channel region 7c by turning around from the substrate 1 side while increasing the pixel aperture ratio.

The first substructure Sla in the present modification example can be formed by a method similar to the method described with reference to FIGS. 3A to 3E. However, in the process shown in FIG. 3B, the second region 41b of the first resist layer 41 may be arranged so as to correspond to the position where the protruding portion H is to be formed.

Figure 5A:
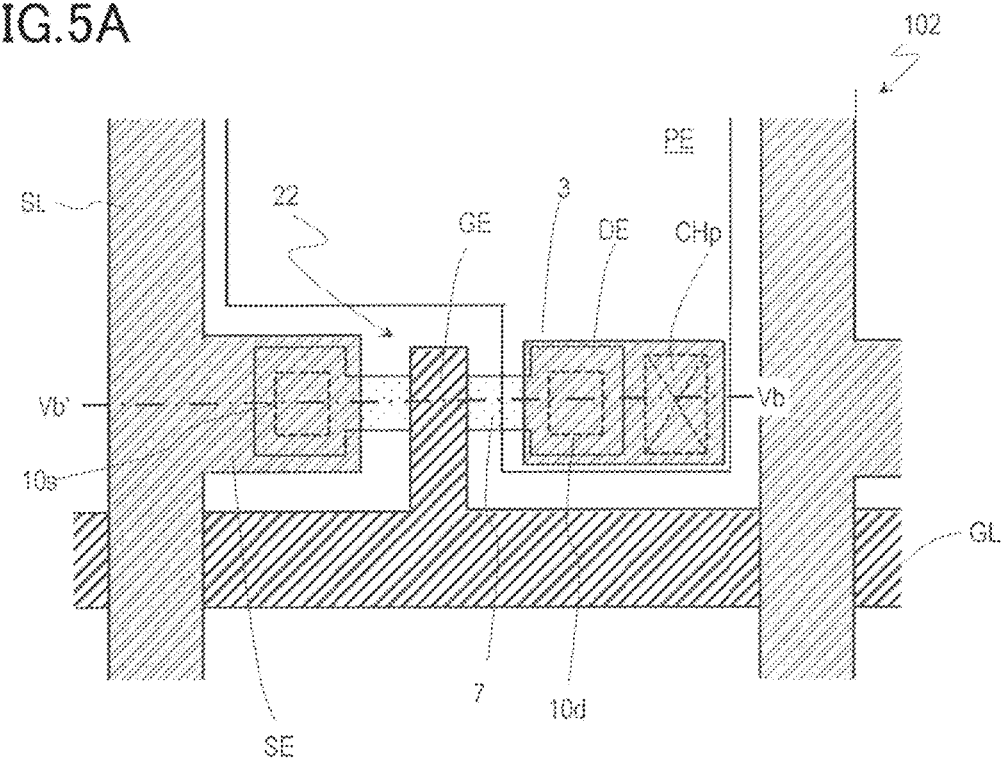
FIG. 5A is a plan view illustrating a portion of a pixel region in an active matrix substrate 102 according to Modification Example 2.
Figure 5B:
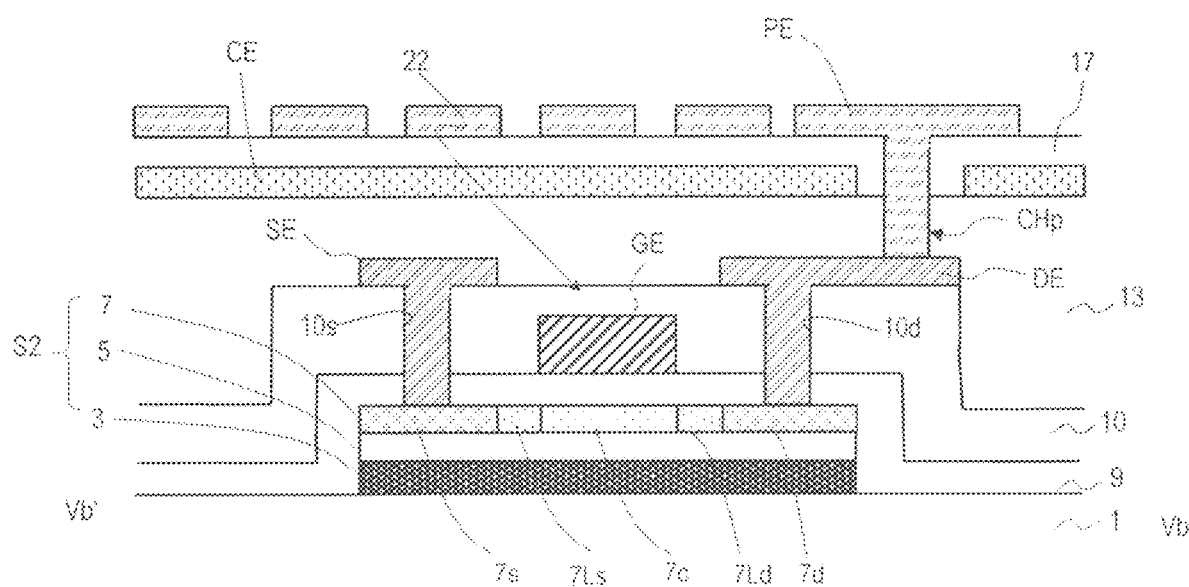
FIG. 5B is a cross-sectional view taken along line Vb-Vb' of the pixel region.

FIG. 5A is a plan view illustrating a portion of a pixel region in an active matrix substrate 102 according to Modification Example 2, and FIG. 5B is a cross-sectional view taken along line Vb-Vb' shown in FIG. 5A.

A TFT 22 in Modification Example 2 is different from the above-mentioned TFT 20 in that it has a second substructure S2 composed of the lower conductive layer 3, the lower insulating layer 5, and the semiconductor layer 7. In the second substructure S2, the side surface of the lower conductive layer 3, the side surface of the lower insulating layer 5, and the side surface of the semiconductor layer 7 are aligned with each other, and the upper surface of the lower conductive layer 3 does not have the protruding portion H. That is, when viewed from the normal direction of the substrate 1, the peripheral edges of the lower conductive layer 3, the lower insulating layer 5, and the semiconductor layer 7 are aligned with each other. Although not shown, the side surface of each layer forming the second substructure S2 may have a tapered shape.

According to Modification Example 2, the area of the lower conductive layer 3 can be further reduced, so that the pixel aperture ratio can be more effectively increased. Further, since the region where the TFT 22 is formed can be reduced, it can be suitably used for a high definition active matrix substrate.

The second substructure S2 can also be formed by a method similar to the method described with reference to FIGS. 3A to 3E, as described below. However, in the process shown in FIG. 3B, the first resist layer 41 is formed so as to have the first region 41a but not the second region 41b in the region where the second substructure S2 is formed. In the pattern of the second substructure S2, the first resist layer 41 can be defined by the first region 41a.

Figure 6:
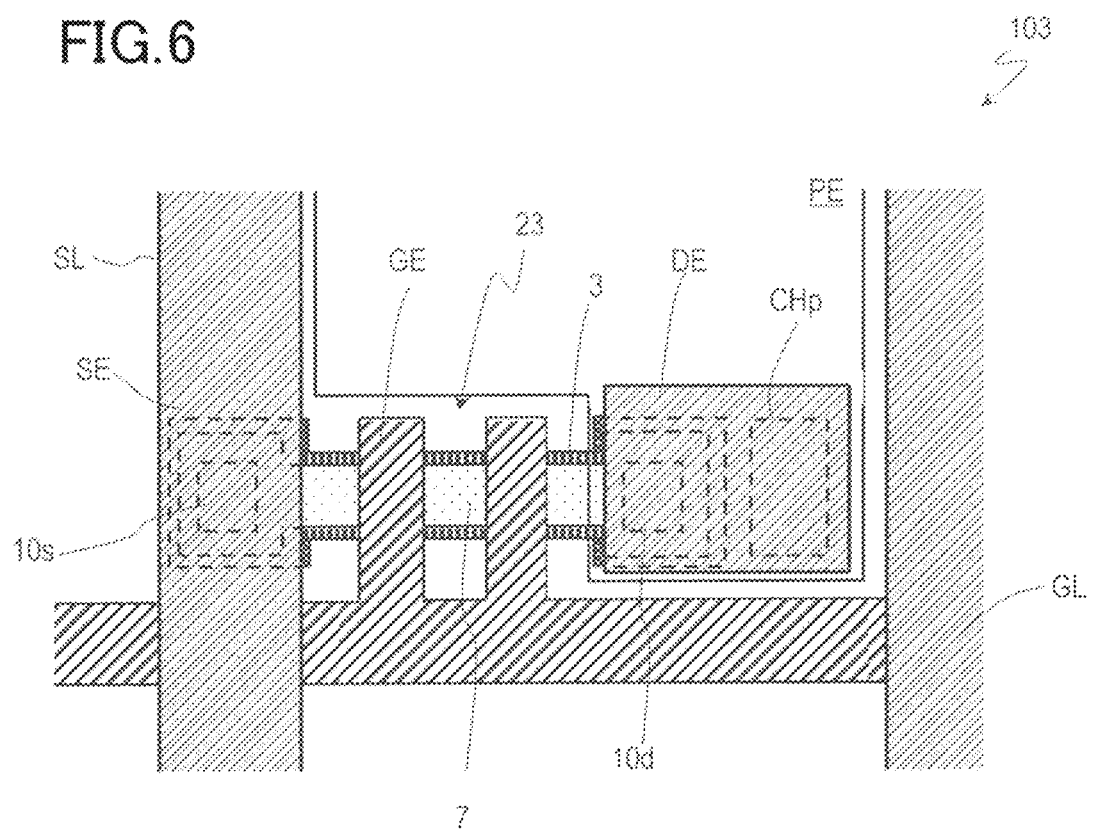
FIG. 6 is a plan view illustrating a portion of a pixel region in an active matrix substrate 103 according to Modification Example 3.

FIG. 6 is a plan view illustrating a portion of a pixel region in an active matrix substrate 103 according to Modification Example 3.

A TFT 23 in Modification Example 3 is different from the TFT 20 (FIGS. 2A and 2B) in that the semiconductor layer 7 has two channel regions (double gate structure).

In this example, the semiconductor layer 7 extends so as to cross two branch portions of the gate bus line GL when viewed from the normal direction of the substrate 1. When viewed from the normal direction of the substrate 1, the portions of the semiconductor layer 7 that overlap these branch portions (gate electrodes GE) become the "channel regions", respectively.

Although not shown, the gate bus line GL may not have a branch portion. In this case, the semiconductor layer 7 having a U-shaped pattern may be arranged so as to cross the gate bus line GL twice.

In this example, the TFT 23 has the first substructure S1, and the lower conductive layer 3 has the protruding portion H over the entire peripheral edge of the semiconductor layer 7 when viewed from the normal direction of the substrate 1. Note that, as illustrated in Modification Example 1, the TFT 23 may have the first substructure S1a. For example, the lower conductive layer 3 may have the protruding portion H only in the peripheral edge portions of the two channel regions. Alternatively, as illustrated in Modification Example 2, the TFT 23 has the second substructure S2, and when viewed from the normal direction of the substrate 1, the peripheral edges of the lower conductive layer 3, the lower insulating layer 5, and the semiconductor layer 7 may be aligned with each other.

(Separate Forming of Plurality of Substructures)

In the present embodiment, after the lower conductive film, the lower insulating film, and the semiconductor film are laminated, a common etching process using a multi-tone mask (for example, a halftone mask) is performed, so that it is possible to separately form a plurality of different substructures on the substrate. Examples of the substructure include a first substructure S1 in which the lower conductive layer has a larger pattern than that of the semiconductor layer, a second substructure S2 in which the lower conductive layer, the lower insulating layer and the semiconductor layer have the same pattern, and a third substructure S3 including the lower conductive layer but not the semiconductor layer and the lower insulating layer.

The active matrix substrate 100 according to the present embodiment may have two or more substructures of the substructures S1 to S3. For example, the active matrix substrate 100 may include a TFT (pixel TFT or circuit TFT) formed using the first substructure S1 (or the second substructure S2) and a wiring formed using the third substructure S3.

FIGS. 7A to 7E are process cross-sectional views for describing a process of forming substructures S1 to S3, and show a first formation region r1 forming the first substructure S1 (or S1a), a second formation region r2 forming the second substructure S2, and a third formation region r3 forming the third substructure S3. Descriptions of components and processes similar to those in FIGS. 3A to 3E are appropriately omitted.

Figure 7A:
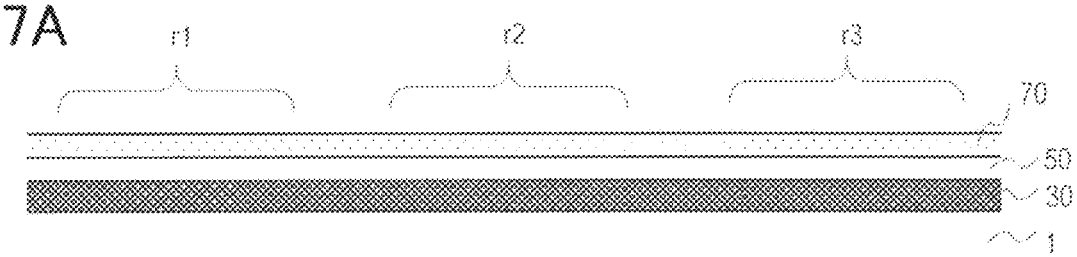
FIG. 7A is a process cross-sectional view for describing a process of forming substructures S1 to S3 separately.

First, as shown in FIG. 7A, the lower conductive film 30, the lower insulating film 50, and the semiconductor film 70 are formed in this order on the substrate 1. The semiconductor film 70 is, for example, a crystalline silicon semiconductor film.

Figure 7B:
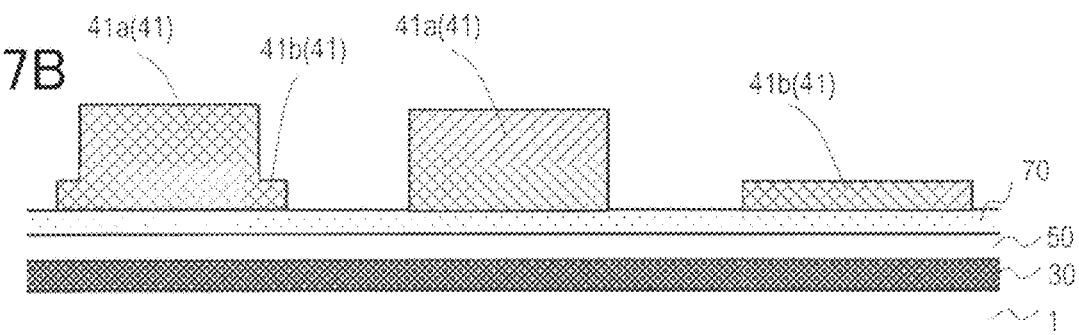
FIG. 7B is a process cross-sectional view for describing a process of forming substructures S1 to S3 separately.

Next, as shown in FIG. 7B, using a halftone mask, the first resist layer 41 including the first region 41a and the second region 41b thinner than the first region 41a is formed on the semiconductor film 70.

In the first formation region r1, the first resist layer 41 has a shape in which the second region 41b is arranged around the first region 41a. When viewed from the normal direction of the substrate 1, the second region 41b may be arranged so as to surround the first region 41a, or the second region 41b may be arranged only on a portion of the peripheral edge of the first region 41a. In the second formation region r2, the first resist layer 41 has the first region 41a and does not have the second region 41b. In the third formation region r3, the first resist layer 41 has the second region 41b and does not have the first region 41a.

Figure 7C:
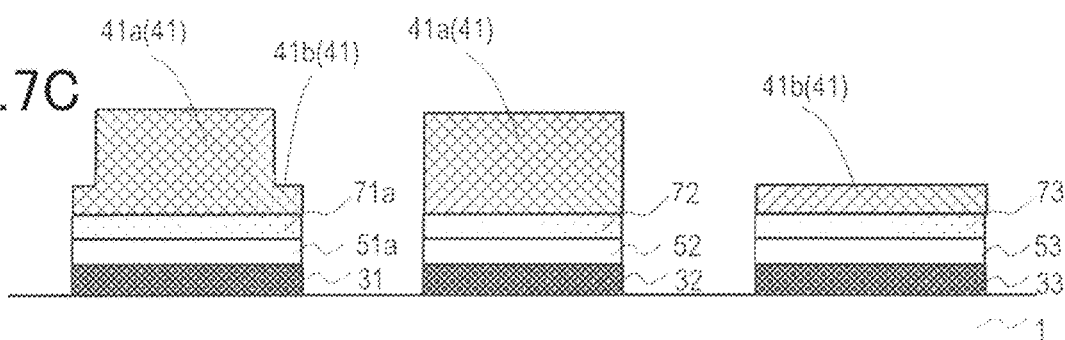
FIG. 7C is a process cross-sectional view for describing a process of forming substructures S1 to S3 separately.

Next, as shown in FIG. 7C, using the first resist layer 41 as a mask, the lower conductive film 30, the lower insulating film 50, and the semiconductor film 70 are etched (first patterning). Thereby, a laminated body including a first lower conductive layer 31, a first lower insulating layer 51a, and a first semiconductor layer 71a is formed in the first formation region r1. Similarly, a laminated body including a second lower conductive layer 32, a second lower insulating layer 52, and a second semiconductor layer 72 is formed in the second formation region r2, and a laminated body including a third lower conductive layer 33, a third lower insulating layer 53, and a third semiconductor layer 73 is formed in the third formation region r3. Side surfaces of the three layers of the laminated body formed in each of the formation regions r1 to r3 are aligned with each other.

Figure 7D:
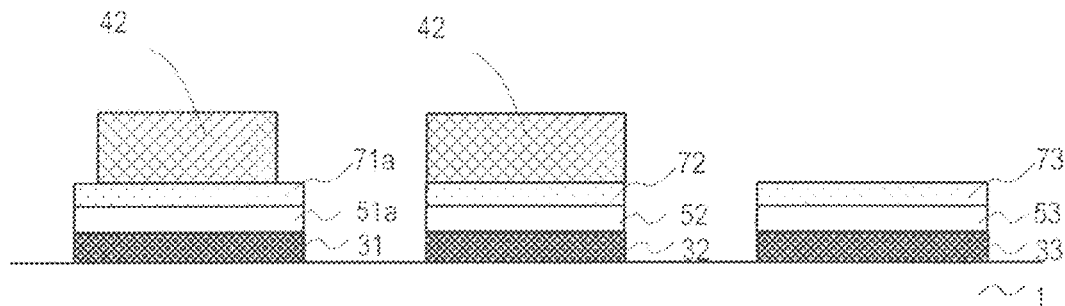
FIG. 7D is a process cross-sectional view for describing a process of forming substructures S1 to S3 separately.

Thereafter, as shown in FIG. 7D, the second region 41b of the first resist layer 41 is removed by ashing to form the second resist layer 42. In the first formation region r1, the width of the resist layer is smaller than that before ashing. In the second formation region r2, the width of the resist layer does not change due to ashing. In the third formation region r3, the entire resist layer is removed by ashing.

Figure 7E:
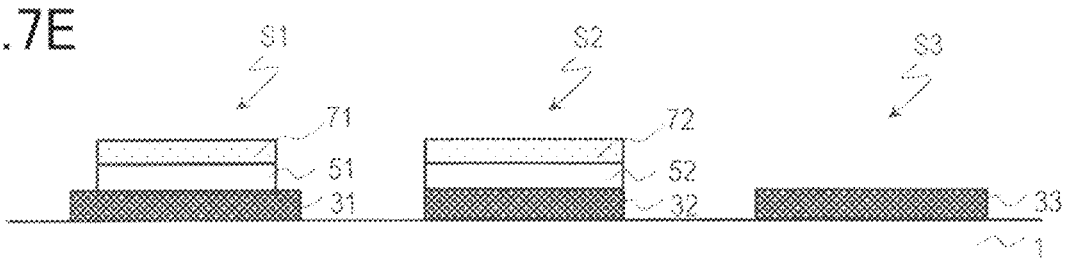
FIG. 7E is a process cross-sectional view for describing a process of forming substructures S1 to S3 separately.

Subsequently, as shown in FIG. 7E, using the second resist layer 42 (that is, the ashed first resist layer 41), the semiconductor layer and the lower insulating layer are etched (second patterning). In the second patterning, the lower conductive layers 31, 32, and 33 are not removed by etching. However, the vicinity of the surface of the exposed portions of the lower conductive layers 31, 32, and 33 may be etched. Thereafter, the second resist layer 42 is peeled off.

In the first formation region r1, the portions of the first lower insulating layer 51a and the first semiconductor layer 71a which are not covered with the second resist layer 42 are removed by the second patterning, and become a first lower insulating layer 51 and a first semiconductor layer 71, respectively. When viewed from the normal direction of the substrate 1, the first lower insulating layer 51 and the first semiconductor layer 71 are located inside the first lower conductive layer 31, for example. In this way, the first substructure S1 is obtained.

In the second formation region r2, the second lower insulating layer 52 and the second semiconductor layer 72 are entirely covered with the second resist layer 42, and thus are not etched in this process. Therefore, the second lower insulating layer 52, the second semiconductor layer 72, and the second lower conductive layer 32 after the first patterning are left as they are to form the second substructure S2.

In the third formation region r3, since the entire resist layer is removed, the third lower insulating layer 53 and the third semiconductor layer 73 located on the third lower conductive layer 33 are all removed by etching, and only the third lower conductive layer 33 remains. In this way, the third substructure S3 is obtained.

(Configuration Using Substructures S1 to S3)

The first substructure S1 can be used for a semiconductor element such as a TFT (for example, a pixel TFT) or a TFT type diode. As described above, the first lower conductive layer 31 can function as a light shielding layer that blocks light traveling from the substrate 1 side toward the first semiconductor layer 71. The protruding portion H of the first semiconductor layer 71 may be used to electrically connect the first lower conductive layer 31 to another wiring. Thereby, it is possible to easily connect the first lower conductive layer 31 to another wiring or a fixed potential.

The second substructure S2 can also be used for a semiconductor element such as a TFT (for example, a circuit TFT). Since the second lower conductive layer 32 and the second semiconductor layer 72 are patterned using the same mask, misalignment does not occur. Therefore, the second lower conductive layer 32 can more reliably block the light traveling from the substrate 1 side toward the second semiconductor layer 72. By using the second substructure S2, it is possible to more reliably suppress deterioration of the characteristics of the semiconductor layer due to backlight light, while ensuring the pixel aperture ratio. Furthermore, since the formation region of the TFT can be made small, when applied to, for example, a circuit TFT, frame narrowing can be achieved.

The third substructure S3 can be used for various wirings. For example, a single-layer wiring composed of only the third lower conductive layer 33 may be formed. Alternatively, as will be described below, by arranging the third lower conductive layer 33 so as to overlap the wiring of another metal layer (source metal layer or gate metal layer) when viewed from the normal direction of the substrate 1, a wiring having a redundant structure or a laminated structure may be formed.

Hereinafter, an example of a specific configuration formed by using the substructures S1 to S3 will be described with reference to the drawings.

<TFT Type Diode>

In an active matrix substrate, a diode ring may be provided between wirings such as source and gate bus lines in order to prevent damage to elements, wirings, and the like due to static electricity. For the arrangement and function of the diode ring, for example, the entire disclosure of Japanese Unexamined Patent Application Publication No. 10-020336 by the present applicant is incorporated herein by reference.

Figure 8A:
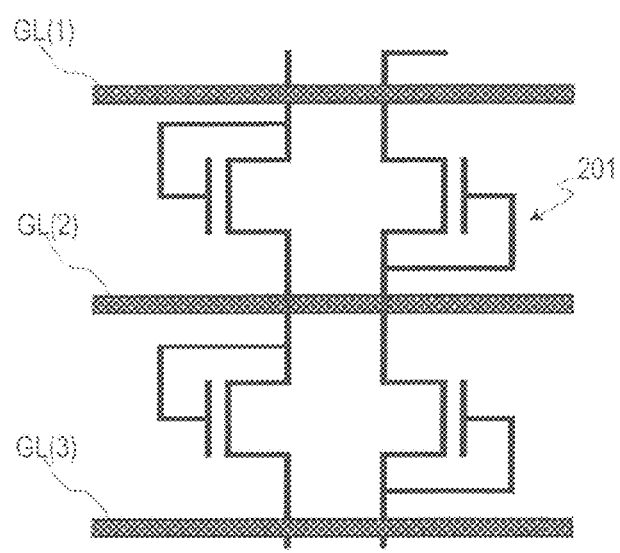
FIG. 8A is a diagram showing a configuration of a diode ring.

As shown in FIG. 8A, for example, the diode ring is configured by arranging two TFT type diodes in mutually opposite directions between two adjacent signal lines (here, the gate bus lines GL). The "TFT type diode" refers to a diode having a structure in which a source and a gate of the TFT are electrically connected, and can be formed using the same semiconductor film as the semiconductor layer of the pixel TFT, for example.

In the present embodiment, the first substructure S1 (or S1a) may be used to form a TFT type diode having a bottom gate structure. The lower conductive layer in the first substructure S1 functions as the gate of the TFT type diode. By using the protruding portion of the lower conductive layer, the source provided above the semiconductor layer and the lower conductive layer can be electrically connected.

Figure 8B:
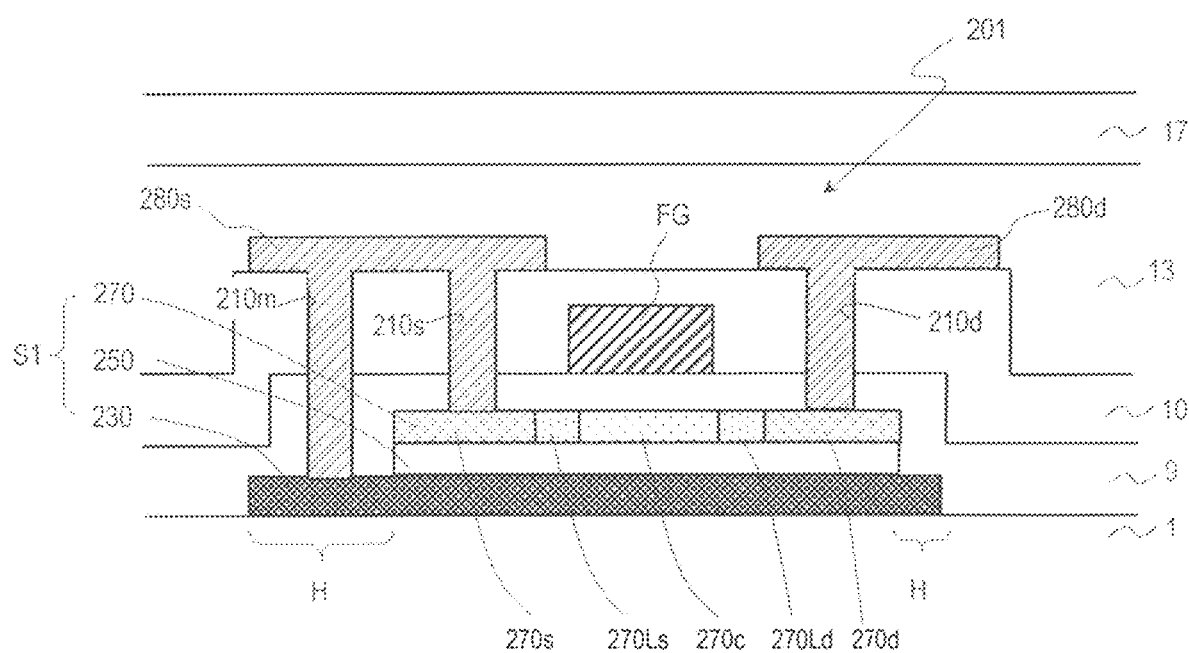
FIG. 8B is a cross-sectional view illustrating a TFT type diode 201 using the first substructure S1.

FIG. 8B is a cross-sectional view illustrating a TFT type diode 201 using the first substructure S1.

The TFT type diode 201 includes the first substructure S1 disposed on the substrate 1, an insulating layer (here, the gate insulating layer 9 and the interlayer insulating layer 10) covering the first substructure S1, and a source electrode 280s and a drain electrode 280d. The first substructure S1 has a lower conductive layer 230 and a semiconductor layer 270 disposed above a portion of the upper surface of the lower conductive layer 230 with a lower insulating layer 250 therebetween. When viewed from the normal direction of the substrate 1, the entire lower insulating layer 250 and the entire semiconductor layer 270 overlap the lower conductive layer 230, and the peripheral edges of the lower insulating layer 250 and the semiconductor layer 270 are aligned with each other. When viewed from the normal direction of the substrate 1, the upper surface of the lower conductive layer 230 has protruding portions H that do not overlap the lower insulating layer 250 and the semiconductor layer 270.

The lower conductive layer 230, the lower insulating layer 250, and the semiconductor layer 270 may be formed of the same semiconductor film as the lower conductive layer, the lower insulating layer, and the semiconductor layer of the TFT (pixel TFT or circuit TFT) formed on the active matrix substrate 100. A crystalline silicon semiconductor layer may be used as the semiconductor layer 270. Thereby, the area required for the diode can be reduced as compared with a TFT type diode using the semiconductor layer of amorphous silicon.

The semiconductor layer 270 has a channel region 270c, and a source region 270s and a drain region 270d that are arranged at both sides of the channel region 270c, respectively. The source region 270s and the drain region 270d are high concentration impurity regions. As shown in the figure, the semiconductor layer 270 may have LDD regions 270Ls and 270Ld containing an impurity (for example, an n-type impurity) at a concentration lower than that of the high concentration impurity region at at least one of a portion between the channel region 270c and the source region 270s and a portion between the channel region 270c and the drain region 270d.

The gate insulating layer 9 is extended so as to cover the first substructure S1. The gate insulating layer 9 may be in direct contact with the side surface of the lower conductive layer 230, the upper surface of the protruding portion H, the side surface of the lower insulating layer 250, and the side surface and the upper surface of the semiconductor layer 270. The interlayer insulating layer 10 is extended on the gate insulating layer 9.

In the gate insulating layer 9 and the interlayer insulating layer 10, a source opening 210s reaching the source region 270s of the semiconductor layer 270, a drain opening 210d reaching the drain region 270d of the semiconductor layer 270, a lower opening 210m reaching the protruding portion H of the lower conductive layer 230 are formed.

The source electrode 280s and the drain electrode 280d are disposed on the interlayer insulating layer 10. The drain electrode 280d and the source electrode 280s may be formed in the source metal layer. The drain electrode 280d is electrically connected to the drain region 270d of the semiconductor layer 270 in the drain opening 210d. The source electrode 280s is electrically connected to the source region 270s of the semiconductor layer 270 in the source opening 210s, and is electrically connected to the protruding portion H of the lower conductive layer 230 that functions as a gate in the lower opening 210m (Here, it is in direct contact with the protruding portion H).

The TFT type diode 201 may further include an island-shaped conductive layer (also referred to as a "floating gate") FG disposed between the gate insulating layer 9 and the interlayer insulating layer 10 so as to overlap the channel region 270c when viewed from the normal direction of the substrate 1. The floating gate FG is formed (in the gate metal layer) using the same conductive film as the gate electrode of the TFT. The floating gate FG is in an electrically floating state and can be used as an implantation mask when implanting impurities into the semiconductor layer 270.

In the TFT type diode 201, the protruding portion H of the lower conductive layer 230 is used to form a gate-source contact portion that electrically connects the source electrode 280s and the lower conductive layer 230 to each other. No additional photolithography process is required to form the gate-source contact portion. Therefore, the TFT type diode 201 can be manufactured by the common process with the TFT 20, for example. The specific manufacturing process will be described below.

<Reflective Region>

Each pixel region in the display region may have a reflective region for performing display (reflective display) using reflected light. The reflective region may be provided with a reflective structure (also referred to as a reflector) using any of the first substructure S1 to the third substructure S3. By providing the reflective region in the display region of the active matrix substrate 100, in a display device including the active matrix substrate 100, power consumption can be reduced and viewability in the outdoors (under sunlight) can be improved.

For example, a reflective structure (reflector including convex-concave portion) may be formed by forming a convex-concave structure using the second substructure S2 or the third substructure S3 in the reflective region and covering the convex-concave structure with a metal layer. The metal layer serving as the reflective surface may be formed in the source metal layer, for example.

Figure 9:
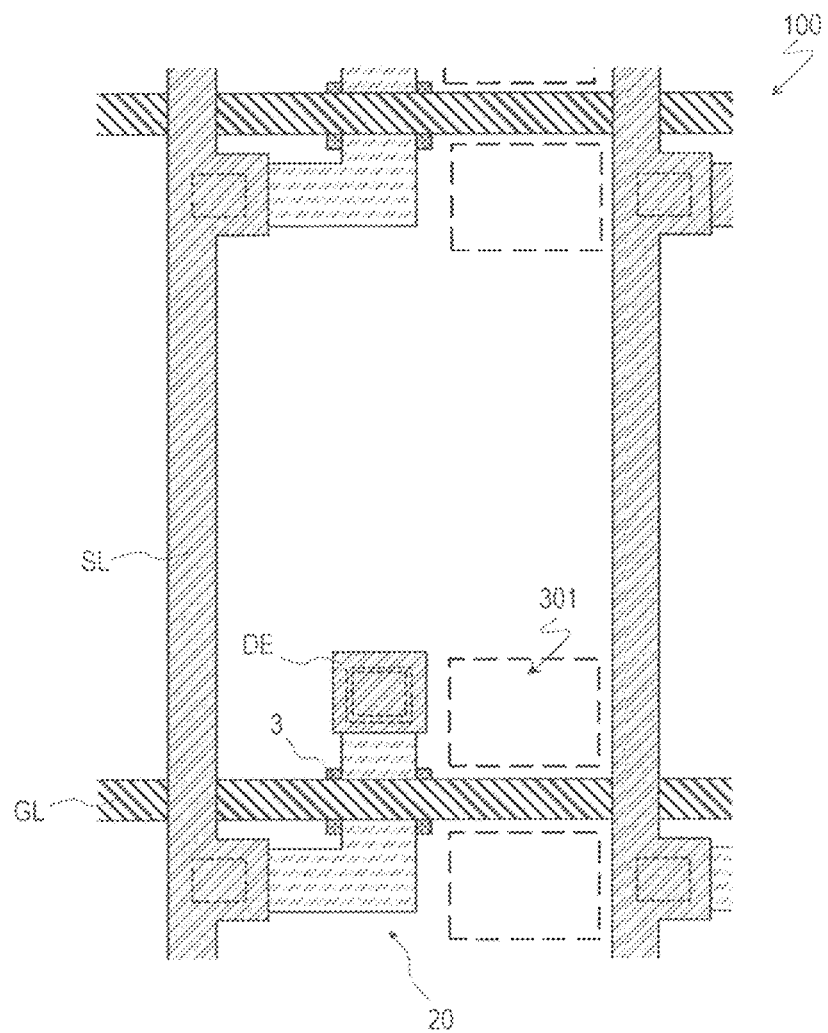
FIG. 9 is a plan view illustrating a portion of the active matrix substrate 100 having a reflective region 301.

FIG. 9 is a plan view illustrating a portion of the active matrix substrate 100 having a reflective region 301. The same components as those in FIG. 2A are designated by the same reference signs.

In this example, a plurality of reflective regions 301 are arranged in the display region so as to be separated from each other. The reflective region 301 may be arranged, for example, in the vicinity of the gate bus line GL or the source bus line SL. The two reflective regions 301 may be arranged so as to sandwich the gate bus line GL. Each reflective region 301 may be in an electrically floating state.

Each reflective region 301 may have a convex-concave structure in which a plurality of unit structures (a plurality of projections or a plurality of recesses) U are two-dimensionally arranged.

Figure 10A:
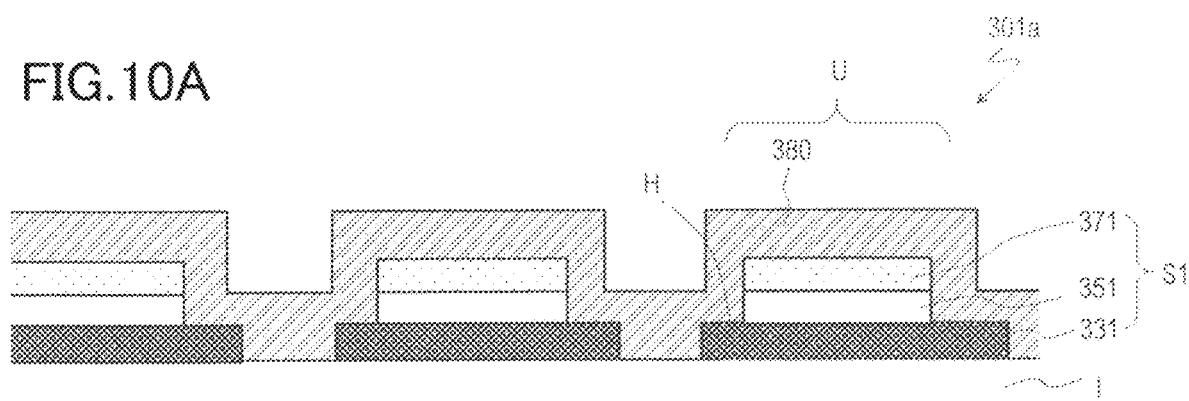
FIG. 10A is a cross-sectional view showing an example of a reflective region 301a using the first substructure S1.

FIG. 10A is a cross-sectional view showing an example of a reflective region 301a.

The reflective region 301a is formed using the first substructure S1. The reflective region 301a is composed of a convex-concave structure including a plurality of first substructures S1 disposed on the substrate 1 and a metal layer 380 covering the convex-concave structure. The first substructure S1 has a lower conductive layer 331 and a semiconductor layer 371 disposed above a portion of the upper surface of the lower conductive layer 331 with a lower insulating layer 351 therebetween. When viewed from the normal direction of the substrate 1, the lower insulating layer 351 and the semiconductor layer 371 are located inside the lower conductive layer 331, and the peripheral edges of the lower insulating layer 351 and the semiconductor layer 371 are aligned with each other. The lower conductive layer 331 has a protruding portion H that does not overlap with either the lower insulating layer 351 or the semiconductor layer 371. The metal layer 380 may be in direct contact with the side surface of the lower conductive layer 331, the upper surface of the protruding portion H of the lower conductive layer 331, and the side surfaces of the lower insulating layer 351 and the semiconductor layer 371, and the upper surface of the semiconductor layer 371. The metal layer 380 has a plurality of unit structures (projections) U reflecting the shapes of the plurality of first substructures S1. The metal layer 380 may be formed of the same conductive film as the source bus line SL (in the source metal layer).

The width of the unit structure U in the reflective region 301a is not particularly limited, but may be, for example, 3 µm or more and 30 µm or less.

The reflective region 301a may be formed across the gate bus line GL. The reflective region 301a is preferably not formed across the source bus line SL. When the reflective region 301a is formed across the source bus line SL, display quality may be deteriorated due to parasitic capacitance.

FIGS. 10B to 10F are cross-sectional views illustrating other reflective regions 301b to 301f, respectively.

Figure 10B:
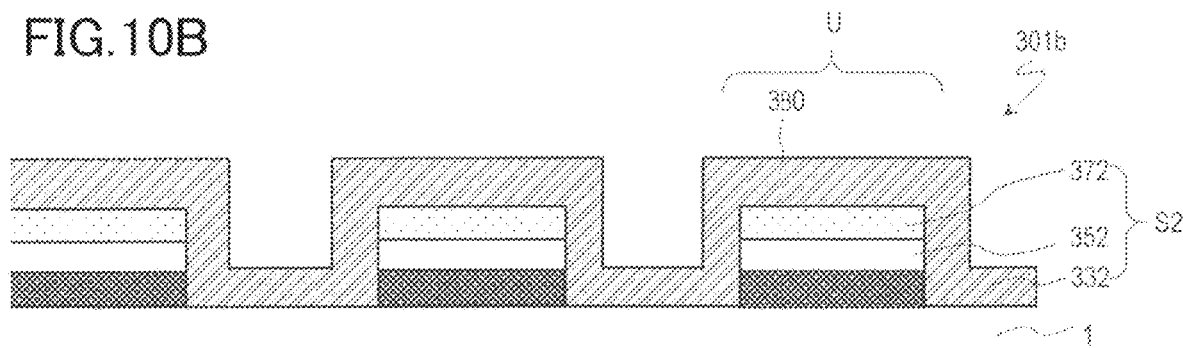
FIG. 10B is a cross-sectional view showing an example of a reflective region 301b using the second substructure S2.

The reflective region 301b shown in FIG. 10B is different from the reflective region 301a shown in FIG. 10A in that a convex-concave structure is formed by using the second substructure S2 instead of the first substructure S1.

The reflective region 301b is formed using the second substructure S2. The reflective region 301b is composed of a convex-concave structure including a plurality of the second substructures S2 disposed on the substrate 1 and the metal layer 380 covering the convex-concave structure. The second substructure S2 has a lower conductive layer 332 and a semiconductor layer 372 disposed above the lower conductive layer 332 with a lower insulating layer 352 therebetween. When viewed from the normal direction of the substrate 1, the peripheral edges of the lower conductive layer 332, the lower insulating layer 352, and the semiconductor layer 372 are aligned with each other. The metal layer 380 may be in direct contact with the side surfaces of the lower conductive layer 332, the lower insulating layer 352, and the semiconductor layer 372, and the upper surface of the semiconductor layer 372. The metal layer 380 has a plurality of unit structures (projections) U reflecting the shapes of the plurality of second substructures S2.

In the above, an example in which a plurality of island-shaped projections is formed by arranging the plurality of first substructures S1 (or second substructures S2) at intervals has been described, but instead, a plurality of recesses may be formed by forming a plurality of openings at intervals in the first substructure S1 or the second substructure S2.

Figure 10C:
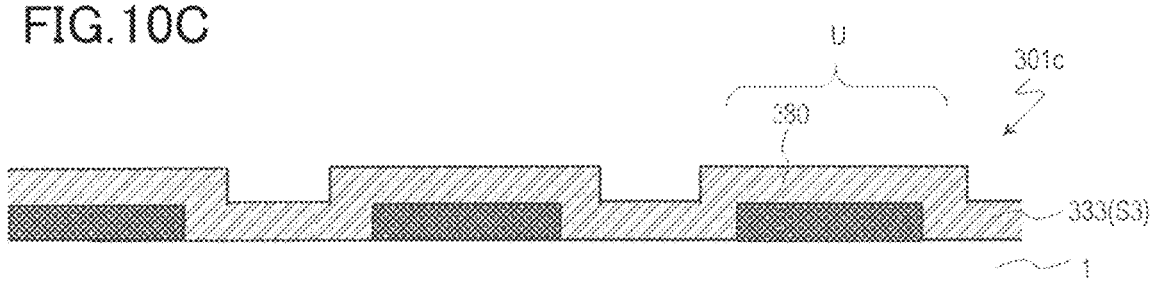
FIG. 10C is a cross-sectional view showing an example of a reflective region 301c using the third substructure S3.
Figure 10D:
FIG. 10D is a cross-sectional view showing an example of a reflective region 301d using the third substructure S3.
Figure 10E:
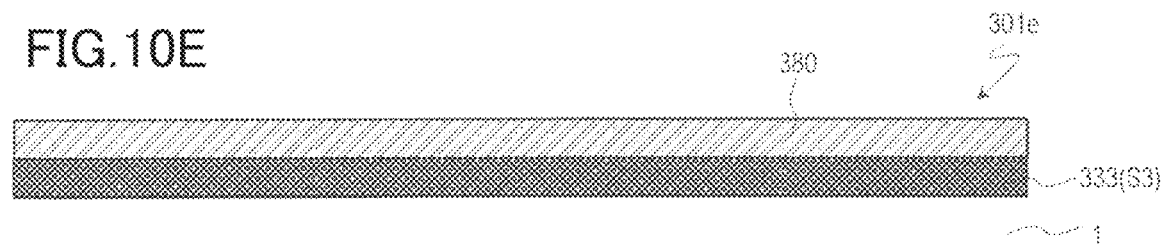
FIG. 10E is a cross-sectional view showing an example of a reflective region 301e using the third substructure S3.

The reflective regions 301c, 301d, and 301e shown in FIGS. 10C to 10E are formed using the third substructure S3.

As shown in FIG. 10C, the reflective region 301c may have a plurality of third substructures S3 (lower conductive layers 333) arranged at intervals and the metal layer 380 arranged so as to cover the upper surfaces and the side surfaces of the plurality of lower conductive layers 333.

The reflective region may not have a convex-concave structure. For example, as shown in FIG. 10D, the reflective region 301d may be composed of only the lower conductive layer 333 in the third substructure S3. Alternatively, as shown in FIG. 10E, the reflective region 301e may have a laminated structure including the lower conductive layer 333 and the metal layer 380 disposed on the lower conductive layer 333 so as to be in contact with the lower conductive layer 333.

Figure 10F:
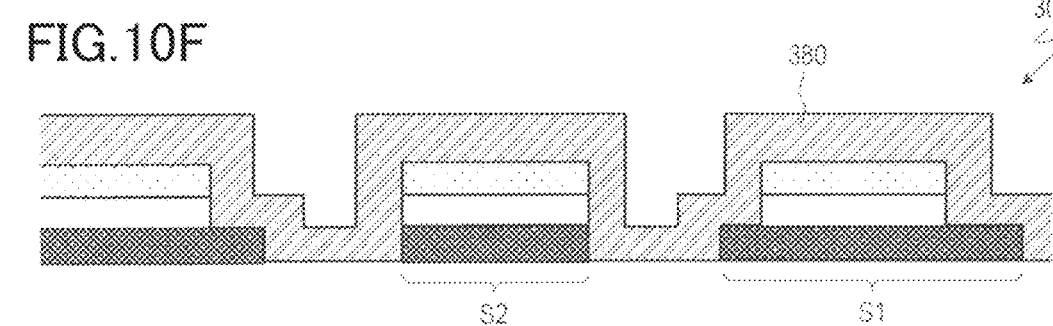
FIG. 10F is a cross-sectional view showing an example of a reflective region 301f using the first substructure S1 and the second substructure S2.

The reflective region 301 may have a convex-concave structure using two or more of the first substructure S1 to the third substructure S3. For example, as shown in FIG. 10F, the reflective region 301f may be formed by covering the convex-concave structure including at least one first substructure S1 and at least one second substructure S2 with the metal layer 380. By using two or more of the first substructure S1 to the third substructure S3, it is possible to make a convex-concave shape of the reflective region 301 different depending on the position.

In the related art, a reflective region (reflector including convex-concave portion) has been formed by patterning an insulating film such as an organic insulating film (for example, a photosensitive resin film) to form a convex-concave structure and covering it with a metal layer. Therefore, in order to form the reflective region, a photo process has been required separately in some cases. On the other hand, for example, in Japanese Unexamined Patent Application Publication No. 2008-186006, a reflective structure (reflector including convex-concave portion) is formed by using the same semiconductor film as the active layer of the TFT to form a pattern composed of a plurality of projections and covering it with a metal layer. However, in this structure, the step of the reflector including convex-concave portion is determined by the thickness of the semiconductor film, and the degree of freedom in design is low. In particular, there is a problem that it is difficult to form a reflector including convex-concave portion having a large step.

In contrast, according to the present embodiment, by using at least one of the first substructure S1 to the third substructure S3, the reflective region 301 having a desired shape (for example, a convex-concave shape) can be formed without adding a photo process.

<Wiring>

The active matrix substrate 100 may include at least one wiring formed by using the third substructure S3.

FIGS. 11A to 11D are cross-sectional views illustrating wirings 401a to 401d in the present embodiment, respectively.

Figure 11A:
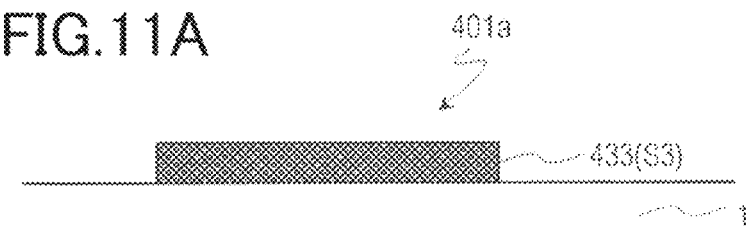
FIG. 11A is a cross-sectional view illustrating a wiring 401a using the third substructure S3.

As shown in FIG. 11A, the wiring 401a may be composed of only a lower conductive layer 433 that is the third substructure S3. Such a wiring 401a may be a wiring constituting a peripheral circuit, for example.

Alternatively, it may be a connection wiring for reconnecting the wiring in the source metal layer or the gate metal layer to another metal layer.

Figure 11B:
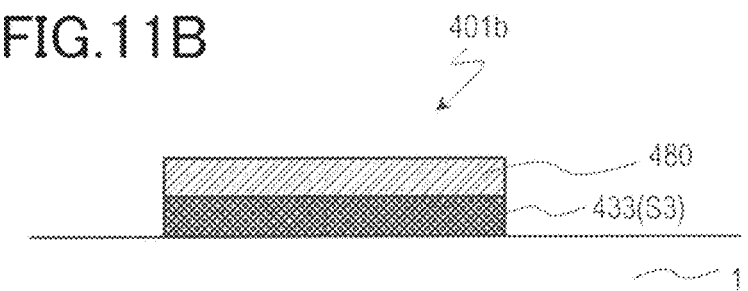
FIG. 11B is a cross-sectional view illustrating a wiring 401b using the third substructure S3.

As shown in FIG. 11B, the wiring 401b has a laminated structure of the lower conductive layer 433 of the third substructure S3 and an upper conductive layer 480 in the source metal layer. Such a wiring 401b can be formed, for example, in a terminal portion or the like.

Figure 11C:
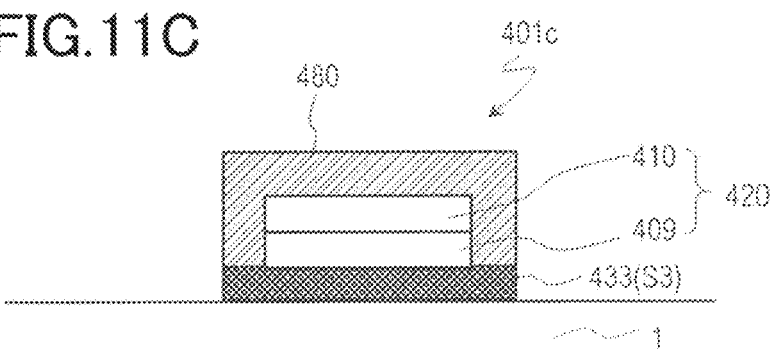
FIG. 11C is a cross-sectional view illustrating a wiring 401c using the third substructure S3.

As shown in FIG. 11C, the wiring 401c has a laminated structure including the lower conductive layer 433 of the third substructure S3, an intermediate insulating layer 420 disposed on a portion of the upper surface of the lower conductive layer 433, and the upper conductive layer 480 that is arranged so as to cover the intermediate insulating layer 420 and that is in contact with another portion of the upper surface of the lower conductive layer 433. The intermediate insulating layer 420 may include, for example, a first intermediate insulating layer 409 formed in the gate insulating layer 9 and a second intermediate insulating layer 410 formed in the interlayer insulating layer 10 from the substrate 1 side. The upper conductive layer 480 may be formed in the source metal layer. The upper conductive layer 480 is disposed on the intermediate insulating layer 420, and is arranged so as to be in contact with a portion of the lower conductive layer 433 that is not in contact with the intermediate insulating layer 420. In this example, in the widthwise cross-section of the wiring 401c, the upper conductive layer 480 covers the side surface and the upper surface of the intermediate insulating layer 420, and is in contact with the upper surface (upper surface of the peripheral edge portion) of the lower conductive layer 433 on both sides of the intermediate insulating layer 420.

The wiring 401c can be suitably applied to, for example, a lead wiring or the like. The lead wiring is a wiring that connects the gate bus line or the source bus line to a terminal portion formed in a region outside a sealing material.

In the wiring 401b having the laminated structure shown in FIG. 11B, a disconnection may occur in both the upper layer and the lower layer of the laminated structure due to the etching process, resulting in a wiring defect. In contrast, the wiring 401c shown in FIG. 11C has a redundant structure in which the lower conductive layer 433 and the upper conductive layer 480 are stacked with the intermediate insulating layer 420 therebetween. Therefore, even if a disconnection occurs in one of the lower conductive layer 433 and the upper conductive layer 480, it is unlikely to occur in the other wiring. Therefore, the occurrence of wiring defects can be suppressed, and the yield can be improved. In addition, there is an advantage that the wiring width can be reduced by having the redundant structure.

Figure 11D:
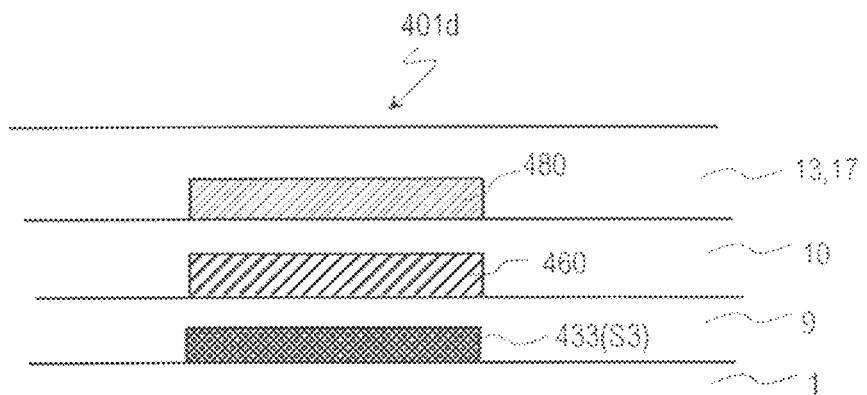
FIG. 11D is a cross-sectional view illustrating a wiring 401d using the third substructure S3.

The wiring 401d shown in FIG. 11D has a redundant structure including the lower conductive layer 433 in the third substructure S3, an intermediate conductive layer 460 disposed above the lower conductive layer 433 via an insulating layer (here, the gate insulating layer 9), and an upper conductive layer 480 disposed above the intermediate conductive layer 460 via an insulating layer (here, the interlayer insulating layer 10). The intermediate conductive layer 460 may be formed in the gate metal layer and the upper conductive layer 480 may be formed in the source metal layer. Although not shown, a contact portion that electrically connects the lower conductive layer 433, the intermediate conductive layer 460, and the upper conductive layer 480 is appropriately provided.

In the wiring 401d, the lower conductive layer 433, the intermediate conductive layer 460, and the upper conductive layer 480 are stacked with the insulating layer interposed therebetween. Therefore, even if a disconnection occurs in any of these conductive layers, it is unlikely to occur in the other conductive layers, so that the yield can be improved. Further, since the wiring width can be reduced, it is suitably applied to, for example, a lead wiring or the like.

A lead wiring may be configured by one or two conductive layers (for example, the lower conductive layer 433 and the intermediate conductive layer 460) constituting the wiring 401d, and a wiring for inspection may be configured by the other conductive layer (for example, the upper conductive layer 480).

Thereby, the area of the region where the wiring is formed can be reduced, so that frame narrowing can be achieved.

Further, the wiring 401d can be corrected when a disconnection occurs in any of the conductive layers. A main wiring may be configured by one or two conductive layers constituting the wiring 401d, and the other conductive layer may be used as an auxiliary wiring. In a case where there is a disconnection in the main wiring, laser light is emitted from either the front or back surface of a liquid crystal panel at two locations, upstream and downstream of the disconnection to melt the main wiring, so that the main wiring and the auxiliary wiring can be joined to each other for correction and improvement. In addition, the correction point by the melt can be specified by observing with an optical microscope, for example.

(Method for Manufacturing Active Matrix Substrate 100)

Next, an example of a method for manufacturing an active matrix substrate according to the present embodiment will be described by taking the active matrix substrate 100 including the TFT 20 and the TFT type diode 201 as an example.

FIGS. 12A to 12K are process cross-sectional views for describing a method for manufacturing the active matrix substrate 100, and show a TFT formation region Rt in which the TFT 20 is formed and a diode formation region Rd in which the TFT type diode 201 is formed. Although not shown for simplicity, the side surface of each layer may have a tapered shape.

Figure 12A:
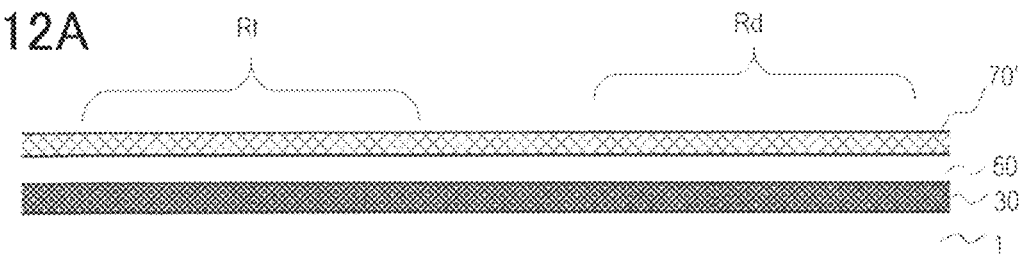
FIG. 12A is a process cross-sectional view showing an example of a method for manufacturing the active matrix substrate 100.

First, as shown in FIG. 12A, the lower conductive film 30, the lower insulating film 50, and an amorphous semiconductor film 70' are formed in this order on the substrate 1.

As the substrate 1, a transparent and insulating substrate such as a glass substrate or a silicon substrate, a heat-resistant plastic substrate (resin substrate), or the like can be used.

The material of the lower conductive film (thickness: for example, 50 nm or more and 500 nm or less) 30 is not particularly limited, a film containing a metal such as aluminum (Al), tungsten (W), molybdenum (Mo), tantalum (Ta), chromium (Cr), titanium (Ti), or copper (Cu) or an alloy thereof, or a metal nitride thereof can be appropriately used. Further, a laminated film obtained by laminating the plurality of films may be used. Here, as the lower conductive film 30, a MoW film (thickness: 50 nm, for example) is formed by a sputtering method.

As the lower insulating film (thickness: for example, 200 nm or more and 600 nm or less) 50, a silicon oxide (SiOx) layer, a silicon nitride (SiNx) layer, a silicon oxynitride (SiOxNy; x>y) layer, a silicon nitride oxide (SiNxOy; x>y) layer, or the like can be appropriately used. The lower insulating film 50 may be a single layer or may have a laminated structure. Here, as the lower insulating film 50, a laminated film having a silicon nitride oxide layer (thickness: for example, 70 nm) for preventing diffusion of impurities and the like from the substrate 1 as a lower layer and a silicon oxide layer (thickness: for example 100 nm) for ensuring insulation as an upper layer is formed by, for example, a CVD method.

As the amorphous semiconductor film 70', a silicon film (a-Si film) having an amorphous structure, for example, is formed by using a known method such as a plasma CVD method or a sputtering method. The thickness of the amorphous semiconductor film 70' is 20 nm or more and 100 nm or less, and preferably 30 to 70 nm. Here, as the amorphous semiconductor film 70', an a-Si film (thickness: 40 nm) is formed by a plasma CVD method. The lower insulating film 50 and the amorphous semiconductor film 70' may be continuously formed by the same film forming method. Thereby, after the lower insulating film 50 is formed, it is possible to prevent the surface thereof from being contaminated by not exposing the lower insulating film to the air atmosphere, and it is possible to reduce variations in the characteristics of the TFT to be manufactured and fluctuations in the threshold voltage.

Thereafter, heat treatment (dehydrogenation annealing) for dehydrogenating the amorphous semiconductor film 70' may be performed. For example, hydrogen in the amorphous semiconductor film 70' may be released by heating the amorphous semiconductor film 70' at a heating temperature of 400° C. to 550° C. for several tens of minutes to several hours.

Figure 12B:
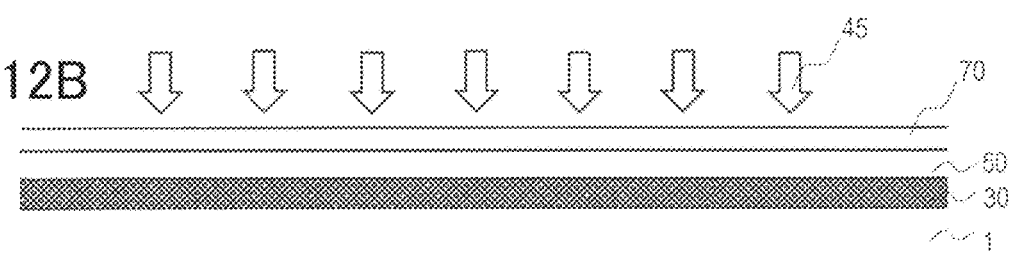
FIG. 12B is a process cross-sectional view showing an example of a method for manufacturing the active matrix substrate 100.

Subsequently, as shown in FIG. 12B, the amorphous semiconductor film 70' is irradiated with laser light 45. Thereby, the amorphous semiconductor film 70' is crystallized in a melting and solidifying process by irradiation with the laser light 45, and becomes the semiconductor film (here, a crystalline S1 film) 70. As the laser light 45, for example, an XeCl excimer laser (wavelength: 308 nm) may be used.

Figure 12C:
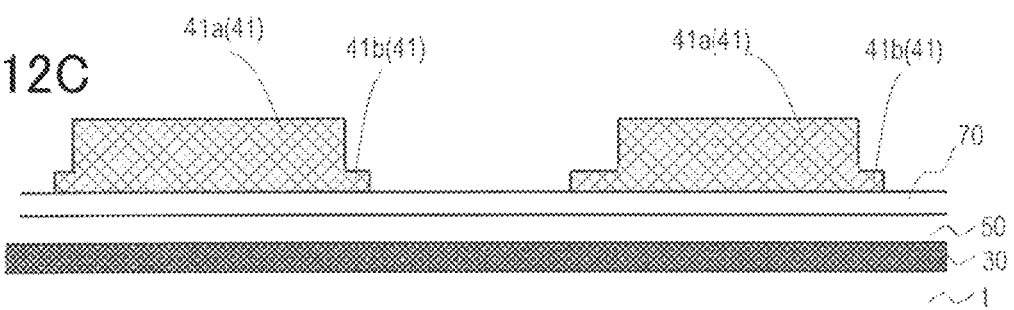
FIG. 12C is a process cross-sectional view showing an example of a method for manufacturing the active matrix substrate 100.

Next, as shown in FIG. 12C, the first resist layer 41 having regions with different heights is formed on the semiconductor film 70 by using a halftone mask. The first resist layer 41 includes the first region 41a and the second region 41b thinner than the first region 41a.

Figure 12D:
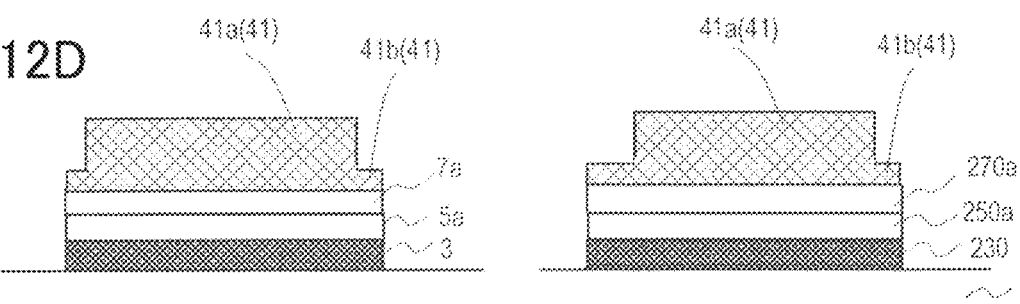
FIG. 12D is a process cross-sectional view showing an example of a method for manufacturing the active matrix substrate 100.

Subsequently, as shown in FIG. 12D, using the first resist layer 41 as a mask, the lower conductive film 30, the lower insulating film 50, and the semiconductor film 70 are etched (first patterning). Thereby, a laminated body including the lower conductive layer 3, the lower insulating layer 5a, and the semiconductor layer 7a is formed in the TFT formation region Rt. A laminated body including the lower conductive layer 230, a lower insulating layer 250a, and a semiconductor layer 270a is formed in the diode formation region Rd.

Figure 12E:
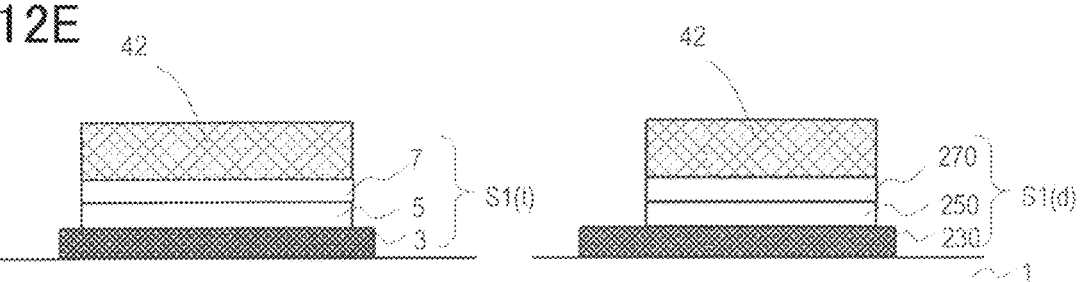
FIG. 12E is a process cross-sectional view showing an example of a method for manufacturing the active matrix substrate 100.

Next, as shown in FIG. 12E, the first resist layer 41 is ashed by dry etching to remove a second region 41b and obtain the second resist layer 42. Subsequently, using the second resist layer 42 (the first resist layer 41 after ashing) as a mask, the lower insulating layer 5a, the lower insulating layer 250a, the semiconductor layer 7a, and the semiconductor layer 270a are etched again (second patterning). Thereby, in the TFT formation region Rt, the exposed portions of the lower insulating layer 5a and the semiconductor layer 7a are removed, and a first substructure S1(t) including the lower conductive layer 3, the lower insulating layer 5, and the semiconductor layer 7 is formed. In the diode formation region Rd, the lower insulating layer 250a and the semiconductor layer 270a are removed, and a first substructure S1(d) including the lower conductive layer 230, the lower insulating layer 250, and the semiconductor layer 270 is formed. Thereafter, the second resist layer 42 is peeled off.

Figure 12F:
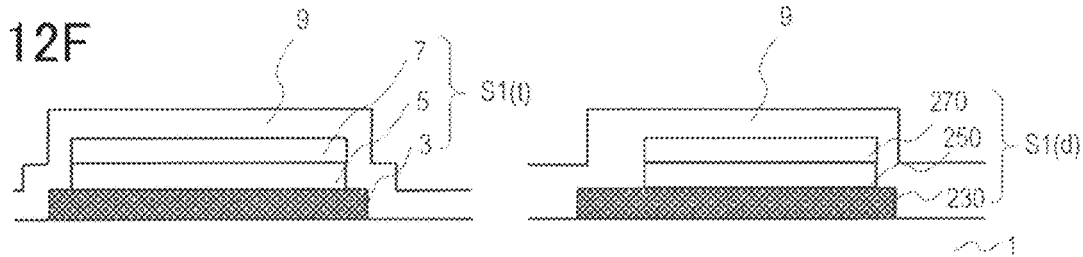
FIG. 12F is a process cross-sectional view showing an example of a method for manufacturing the active matrix substrate 100.

Subsequently, as shown in FIG. 12F, the gate insulating layer (thickness: for example, 20 to 150 nm) 9 covering the first substructures S1(t) and S1(d) is formed. Here, as the gate insulating layer 9, a silicon oxide film having a thickness of 85 nm is formed. The silicon oxide film can be formed by, for example, a plasma CVD method using tetraethoxysilane (TEOS) as a material gas.

Figure 12G:
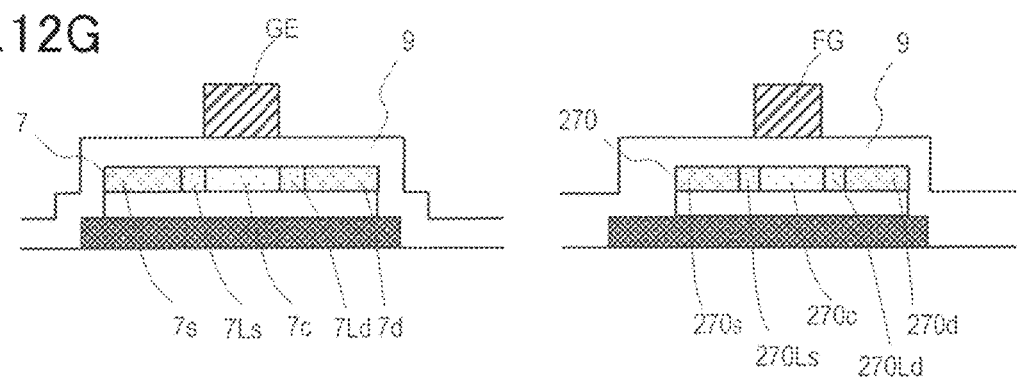
FIG. 12G is a process cross-sectional view showing an example of a method for manufacturing the active matrix substrate 100.

Thereafter, as shown in FIG. 12G, on the gate insulating layer 9, the gate electrode GE is formed so as to overlap a portion of the semiconductor layer 7 and the floating gate FG is formed so as to overlap a portion of the semiconductor layer 270 when viewed from the normal direction of the substrate 1. Before or after forming the gate electrode GE and the floating gate FG, the semiconductor layer 7 and the semiconductor layer 270 are doped with impurities to form high concentration impurity regions and LDD regions as appropriate. The type, concentration, and the like of impurities can be selected to obtain the desired TFT structure and characteristics.

In this example, a gate conductive film (thickness: for example, 300 to 600 nm) is formed on the gate insulating layer 9 by a sputtering method and patterned to obtain the gate electrode GE and the floating gate FG. The material of the gate conductive film is not particularly limited, a film containing a metal such as aluminum (Al), tungsten (W), molybdenum (Mo), tantalum (Ta), chromium (Cr), titanium (Ti), or copper (Cu) or an alloy thereof can be appropriately used. Further, a laminated film obtained by laminating the plurality of films may be used. Here, as the gate conductive film, a laminated film having a TaN film (thickness: 24 nm) as a lower layer and a W film (thickness: 300 nm) as an upper layer is used. Thereafter, using the gate electrode GE and the floating gate FG as a mask, a low concentration n-type impurity (phosphorus) is implanted into the entire surface of the semiconductor layer 7 and the semiconductor layer 270 from above the substrate 1 by an ion doping method. Subsequently, a resist mask (not shown) is provided so as to entirely cover each of the gate electrode GE and the floating gate FG, and using the resist mask as a mask, the n-type impurity (phosphorus) is implanted into the semiconductor layer 7 and the semiconductor layer 270 at a high concentration. Thereby, the regions of the semiconductor layer 7 and the semiconductor layer 270 into which phosphorus is implanted at a high concentration become the source regions 7s and 270s and the drain regions 7d and 270d. Further, the regions of the semiconductor layer 7 and the semiconductor layer 270 into which phosphorus is not implanted at a high concentration and which remain in a state where phosphorus is implanted at a low concentration become the LDD regions 7Ls, 7Ld, 270Ls, and 270Ld.

Although not shown, when a p-channel type TFT is also formed on the substrate 1 at the same time, a high concentration impurity region and an LDD region may be formed as appropriate by implanting p-type impurities (for example, boron) into a semiconductor layer that is an active layer of the p-channel type TFT.

After implanting the impurities into the semiconductor layer 7 and the semiconductor layer 270, heat treatment (activation treatment) for activating the ion-implanted impurities is performed in an inert atmosphere.

Figure 12H:
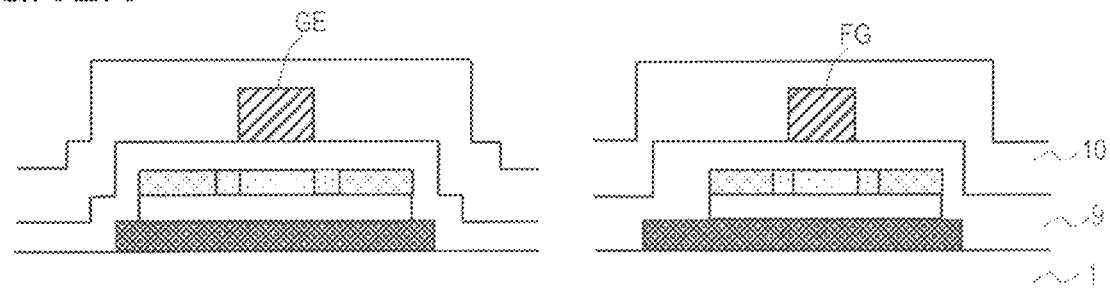
FIG. 12H is a process cross-sectional view showing an example of a method for manufacturing the active matrix substrate 100.

Next, as shown in FIG. 12H, the interlayer insulating layer (thickness: for example, 400 to 1000 nm) 10 is formed. Here, as the interlayer insulating layer 10, a laminated film having a silicon nitride film (thickness: 160 nm) as a lower layer and a silicon oxide film (thickness: 680 nm) as an upper layer is formed. Thereafter, for example, annealing is performed at 350° C. to 450° C. in a nitrogen atmosphere or a hydrogen mixed atmosphere to hydrogenate the semiconductor layer 7 and the semiconductor layer 270 to reduce crystal defects.

Figure 12I:
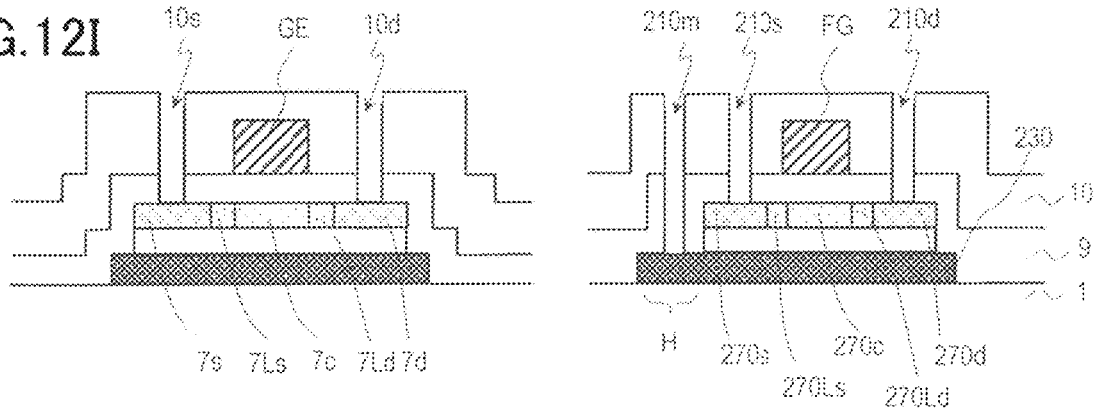
FIG. 12I is a process cross-sectional view showing an example of a method for manufacturing the active matrix substrate 100.

Subsequently, as shown in FIG. 12I, the source opening 10s exposing the source region 7s of the semiconductor layer 7, the drain opening 10d exposing the drain region 7d, the source opening 210s exposing the source region 270s of the semiconductor layer 270, and the drain opening 210d exposing the drain region 270d are provided in the interlayer insulating layer 10. At the same time, the lower opening 210m for gate-source connection is provided in the interlayer insulating layer 10 and the gate insulating layer 9 so as to expose the lower conductive layer 230. The lower opening 210m is arranged so as to expose a portion of the protruding portion H of the lower conductive layer 230.

Figure 12J:
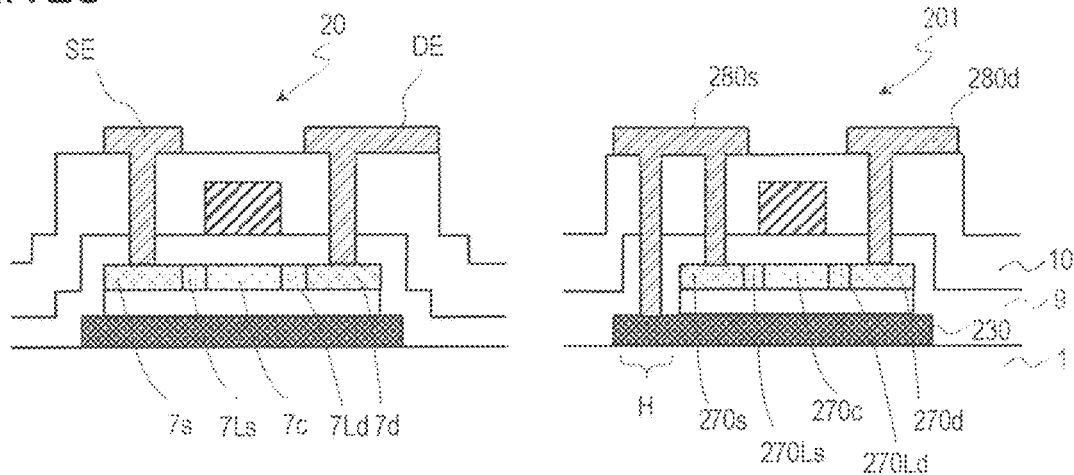
FIG. 12J is a process cross-sectional view showing an example of a method for manufacturing the active matrix substrate 100.

Thereafter, as shown in FIG. 12J, a source conductive film is formed on the interlayer insulating layer 10 and in each opening of the interlayer insulating layer 10 and patterned to obtain a source metal layer. Thereby, in the TFT formation region Rt, the source electrode SE in contact with the source region 7s of the semiconductor layer 7 in the source opening 10s, and the drain electrode DE in contact with the drain region 7d of the semiconductor layer 7 in the drain opening 10d are formed, and the TFT 20 is obtained. In the diode formation region Rd, the source electrode 280s that is in contact with the source region 270s of the semiconductor layer 270 in the source opening 210s and is in contact with the lower conductive layer 230 in the lower opening 210m, and the drain electrode 280d in contact with the drain region 270d of the semiconductor layer 270 in the drain opening 210d are formed, and the TFT type diode 201 is obtained.

The material of the source electrode film is not particularly limited, a film containing a metal such as aluminum (Al), tungsten (W), molybdenum (Mo), tantalum (Ta), copper (Cu), chromium (Cr) or titanium (Ti) or an alloy thereof, or a metal nitride thereof can be appropriately used. Here, as the source electrode film, there is a laminated film in which a Ti film (thickness: 20 nm), an Al film (thickness: 300 nm), and a Ti film (thickness: 30 nm) are stacked from the substrate 1 side.

Figure 12K:
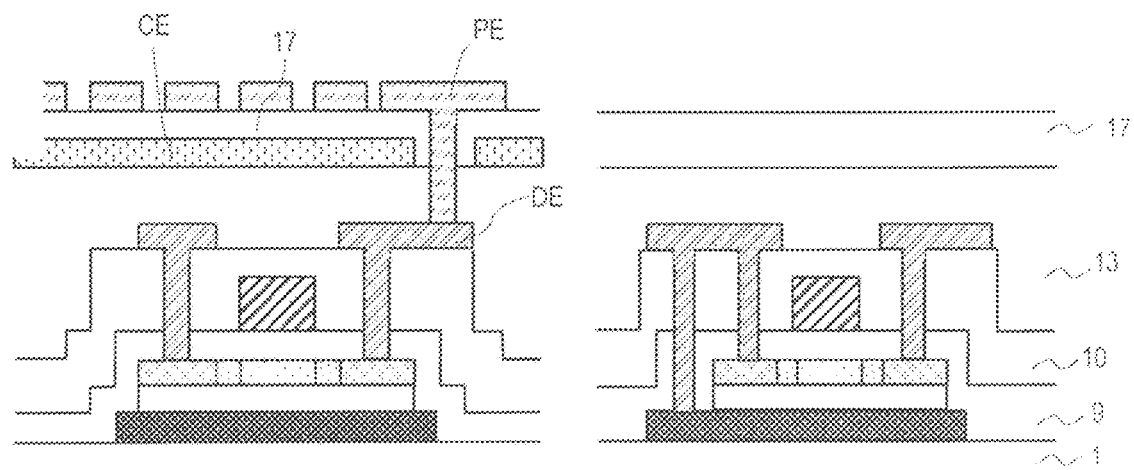
FIG. 12K is a process cross-sectional view showing an example of a method for manufacturing the active matrix substrate 100.

Next, as shown in FIG. 12K, the upper insulating layer 13 is formed so as to cover the source metal layer. As the upper insulating layer 13, an inorganic insulating layer (thickness: 100 nm or more and 500 nm or less) and an organic insulating layer (thickness: 1 to 3 μm, preferably 2 to 3 μm) may be formed in this order.

The inorganic insulating layer may be a silicon oxide (SiOx) layer, a silicon nitride (SiNx) layer, or a silicon oxynitride (SiNxOy) layer. The organic insulating layer may be, for example, an organic insulating film containing a photosensitive resin material (for example, an acrylic resin film). Thereafter, the organic insulating layer is patterned to form an opening in the organic insulating layer. A portion of the organic insulating layer located in the non-display region may be removed.

Subsequently, the common electrode CE is formed on the upper insulating layer 13. Specifically, first, a first transparent conductive film (thickness: 20 to 300 nm) is formed on the upper insulating layer and in an opening 12p and patterned to obtain the common electrode CE. Here, an indium tin oxide (ITO) film (thickness: 70 nm) is formed as the first transparent conductive film by a sputtering method. The common electrode CE may have an opening on a region where the pixel contact hole CHp is formed. The common electrode CE may be arranged over substantially the entire display region except the pixel contact hole formation region.

Next, the dielectric layer (thickness: 50 to 500 nm) 17 is formed so as to cover the common electrode CE. Here, as the dielectric layer 17, for example, a silicon nitride film (thickness: 100 nm) is formed by a CVD method. Next, the pixel contact hole CHp reaching the drain electrode DE of the TFT 20 is formed in the dielectric layer 17 and the upper insulating layer 13. When the upper insulating layer 13 includes an organic insulating layer and an inorganic insulating layer, the pixel contact hole CHp may be formed by providing an opening in the organic insulating layer before forming the dielectric layer 17, and by simultaneously etching the dielectric layer 17 and the inorganic insulating layer after forming the dielectric layer 17.

Next, a second transparent conductive film (thickness: 20 to 300 nm) is formed on the dielectric layer 17 and in the pixel contact hole CHp, and patterned to obtain the pixel electrode PE. Here, for example, an indium-zinc oxide film is formed as the second transparent conductive film by a sputtering method. In this way, the active matrix substrate 100 is manufactured.

Figure 13:
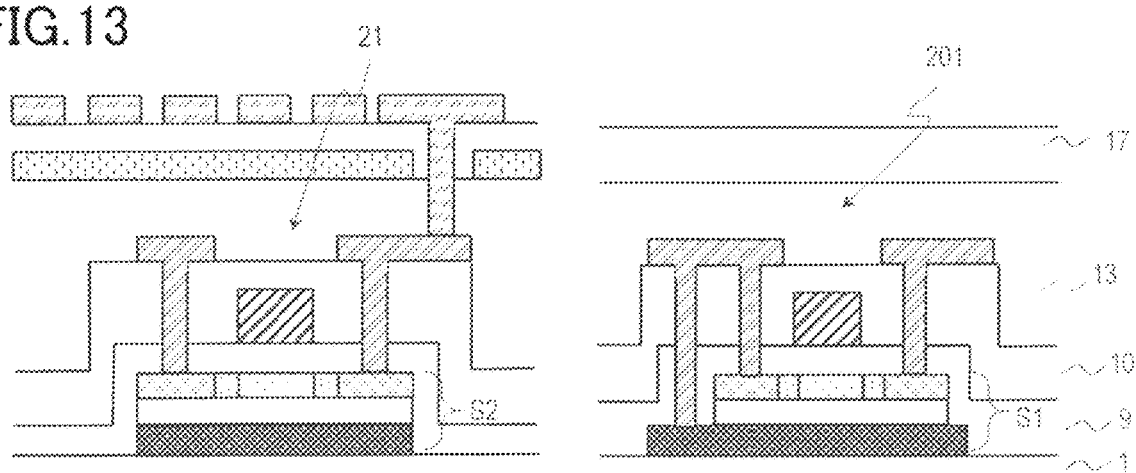
FIG. 13 is a process cross-sectional view showing an example of a method for manufacturing the active matrix substrate 100.

In the present embodiment, as described above with reference to FIGS. 7A to 7E, in addition to the first substructure S1, the second substructure S2 and/or the third substructure S3 can be formed in the common process. In the example shown in FIGS. 12A to 12K, the TFT 20 and the TFT type diode 201 are both formed using the first substructure S1, but as shown in FIG. 13, the TFT 22 (pixel TFT or circuit TFT) may be formed using the second substructure S2, and the TFT type diode 201 may be formed using the first substructure S1. Further, the wirings 401a to 401d and the reflective regions 301a to 301f described above can be manufactured on the substrate 1 (without separately adding a photo process) in the process common to the process of forming the TFT including the first substructure. For example, in the process shown in FIG. 12I, by providing an opening having a large width in the interlayer insulating layer 10 and the gate insulating layer 9 so as to expose the lower metal layer, it is possible to form a laminated structure (such as FIGS. 10C, 10E, and 11B) of a lower metal layer and a source metal layer in the opening.

An active matrix substrate including a crystalline silicon TFT has been described above as an example, but the active matrix substrate of the present embodiment may use an oxide semiconductor TFT as the pixel TFT and/or the circuit TFT. For example, in the above method, the semiconductor layer 7 and the semiconductor layer 270 may be oxide semiconductor layers. In that case, the source region and the drain region, which are low-resistance regions of the oxide semiconductor layer, can be formed, for example, by performing a resistance-reduction process on the oxide semiconductor layer using the gate electrode as a mask.

<Regarding Oxide Semiconductor>

The oxide semiconductor included in the oxide semiconductor layer may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor in which a c axis is oriented substantially perpendicular to the layer surface.

The oxide semiconductor layer may have a laminated structure of two or more layers. When the oxide semiconductor layer has a laminated structure, the oxide semiconductor layer may include an amorphous oxide semiconductor layer and a crystalline oxide semiconductor layer. Alternatively, it may include a plurality of crystalline oxide semiconductor layers having different crystalline structures. In addition, it may include a plurality of amorphous oxide semiconductor layers. When the oxide semiconductor layer has a two-layer structure including an upper layer and a lower layer, an energy gap of the oxide semiconductor included in the layer (the lower layer in the case of the bottom gate structure and the upper layer in the case of the top gate structure) located on the gate electrode side of the two layers may be smaller than an energy gap of the oxide semiconductor included in the layer (the upper layer in the case of the bottom gate structure and the lower layer in the case of the top gate structure) located on the side opposite to the gate electrode. However, when the difference in energy gap between these layers is relatively small, the energy gap of the oxide semiconductor in the layer located on the gate electrode side may be larger than the energy gap of the oxide semiconductor in the layer located on the side opposite to the gate electrode.

Materials, structures, film forming methods, configurations of oxide semiconductor layers having a laminated structure, and the like of the amorphous oxide semiconductor and the above crystalline oxide semiconductors are described in, for example, Japanese Unexamined Patent Application Publication No. 2014-007399. For reference, the entire disclosure of Japanese Unexamined Patent Application Publication No. 2014-007399 is incorporated herein.

The oxide semiconductor layer may include, for example, at least one metal element of In, Ga, and Zn. In the present embodiment, the oxide semiconductor layer includes, for example, an In—Ga—Zn—C-based semiconductor (for example, indium gallium zinc oxide). Here, the In—Ga—Zn—C-based semiconductor is a ternary oxide of In (indium), Ga (gallium), and Zn (zinc), the ratio (composition ratio) of In to Ga to Zn is not particularly limited and includes, for example, In:Ga:Zn=2:2:1, In:Ga:Zn=1:1:1, In:Ga:Zn=1:1:2, and the like. Such an oxide semiconductor layer can be formed from an oxide semiconductor film including an In—Ga—Zn—C-based semiconductor.

The In—Ga—Zn—C-based semiconductor may be amorphous or crystalline. As the crystalline In—Ga—Zn—C-based semiconductor, a crystalline In—Ga—Zn—C-based semiconductor in which the c axis is oriented substantially perpendicular to the layer surface is preferable.

The crystalline structure of the crystalline In—Ga—Zn-0-based semiconductor is disclosed, for example, in the above-mentioned Japanese Unexamined Patent Application Publication No. 2014-007399, Japanese Unexamined Patent Application Publication No. 2012-134475, Japanese Unexamined Patent Application Publication No. 2014-209727, and the like. For reference, the entire disclosures of Japanese Unexamined Patent Application Publication No. 2012-134475 and Japanese Unexamined Patent Application Publication No. 2014-209727 are incorporated herein. A TFT having an In—Ga—Zn—O-based oxide semiconductor layer has high mobility (more than 20 times compared to an a-Si TFT) and low leakage current (less than 1/100 compared to an a-Si TFT). Therefore, it is suitably used as a drive TFT (for example, a TFT included in a drive circuit provided on the same substrate as a display region around the display region including a plurality of pixels) and a pixel TFT (TFT provided in a pixel).

The oxide semiconductor layer may include another oxide semiconductor instead of the In—Ga—Zn—O-based semiconductor. For example, the oxide semiconductor layer may include an In—Sn—Zn—O-based semiconductor (for example, $In_2O_3$—$SnO_2$—ZnO; InSnZnO). The In—Sn—Zn—O-based semiconductor is a ternary oxide of In (indium), Sn (tin), and Zn (zinc).

Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), a Mg—Zn—O-based semiconductor, an In—Ga—

Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, or the like.

While there have been described what are at present considered to be certain embodiments of the disclosure, it will be understood that various modifications may be made thereto, and it is intended that the appended claim cover all such modifications as fall within the true spirit and scope of the disclosure.

What is claimed is:

1. A method for manufacturing an active matrix substrate including at least one first formation region in which a first substructure is formed, the method comprising:
    forming a laminated film including a lower conductive film, a lower insulating film, and a semiconductor film in this order on a substrate;
    forming a first resist layer including a first region and a second region thinner than the first region by forming a resist film on the laminated film and exposing and developing the resist film using a multi-tone photomask, the first resist layer including the first region and the second region that is arranged in contact with at least a portion of a peripheral edge of the first region in the at least one first formation region;
    performing a patterning on the laminated film, including:
        performing a first patterning on the lower conductive film, the lower insulating film, and the semiconductor film in the laminated film using the first resist layer as a mask to obtain a laminated body,
        after performing the first patterning, aching the first resist layer and removing the second region of the first resist layer to obtain a second resist layer, and
        performing a second patterning on the semiconductor film and the lower insulating film in the laminated body using the second resist layer as a mask, performing the second patterning including exposing the lower conductive film by removing a portion which is not covered with the second resist layer in the semiconductor film and the lower insulating film of the laminated body,
        thereby, in the at least one first formation region, forming the first substructure including a first lower conductive layer, a first lower insulating layer, and a first semiconductor layer respectively formed from the lower conductive film, the lower insulating film, and the semiconductor film, aligning a side surface of the first semiconductor layer and a side surface of the first lower insulating layer with each other, overlapping an entirety of the first lower insulating layer and an entirety of the first semiconductor layer with the first lower conductive layer when viewed from a normal direction of the substrate, and causing an upper surface of the first lower conductive layer to have a protruding portion located outside a peripheral edge of the first semiconductor layer, the protruding portion having a width defined by a width of the second region of the first resist layer; and
    forming a source electrode and a drain electrode electrically connected to the first semiconductor layer in the first substructure, thereby obtaining a semiconductor element having the first semiconductor layer as an active layer and the first lower conductive layer as a light shielding layer or a lower gate electrode.

2. The method according to claim 1, wherein:
    the active matrix substrate further includes at least one second formation region in which a second substructure is formed, and the at least one second formation region is arranged so as to not overlap with the at least one first formation region,
    in forming the first resist layer, in the at least one second formation region, the first resist layer includes the first region and does not include the second region, and
    in performing the patterning on the laminated film, in the at least one second formation region, the second substructure being formed includes a second lower conductive layer, a second lower insulating layer, and a second semiconductor layer respectively formed from the lower conductive film, the lower insulating film, and the semiconductor film, and in the second substructure, a side surface of the second lower conductive layer, a side surface of the second semiconductor layer, and a side surface of the second lower insulating layer are aligned with each other.

3. The method according to claim 1, wherein:
    the active matrix substrate further includes at least one third formation region in which a third substructure is formed, and the at least one third formation region is arranged so as to not overlap with the at least one first formation region,
    in forming the first resist layer, in the at least one third formation region, the first resist layer includes the second region and does not include the first region, and
    in performing the patterning on the laminated film, in the at least one third formation region, the semiconductor film and the lower insulating film are removed, and the third substructure is formed that includes a third lower conductive layer formed from the lower conductive film.

4. A method for manufacturing an active matrix substrate including at least one first formation region in which a first substructure is formed, at least one second formation region in which a second substructure is formed, and at least one third formation region in which a third substructure is formed, the at least one first formation region, the at least one second formation region, and the at least one third formation region not being overlapped with each other, the method comprising:
    forming a laminated film including a lower conductive film, a lower insulating film, and a semiconductor film in this order on a substrate;
    forming a first resist layer including a first region and a second region thinner than the first region by forming a resist film on the laminated film and exposing and developing the resist film using a multi-tone photomask, the first resist layer including the first region and the second region that is arranged in contact with at least a portion of a peripheral edge of the first region in the at least one first formation region, the first resist layer including the first region and not including the second region in the at least one second formation region, and the first resist layer, including the second region and not including the first region in the at least one third formation region;
    performing a patterning on the laminated film including:
        performing a first patterning on the lower conductive film, the lower insulating film, and the semiconductor film in the laminated film using the first resist layer as a mask to obtain a laminated body in each of the at least one first formation region, the at least one second formation region, and the at least one third formation region, after performing the first patterning, ashing the first resist layer and removing the second region of the first resist layer to obtain a second resist layer, and performing a second patterning on the semiconductor film and the lower insulating film in the laminated body using the second resist layer as a mask, performing the second patterning including exposing the lower conductive film by removing a portion which is not covered with the second resist layer in the semiconductor film and the lower insulating film of the laminated body, thereby, in the at least one first formation region, forming the first substructure including a first lower conductive layer, a first lower insulating layer, and a first semiconductor layer respectively formed from the lower conductive film, the lower insulating film, and the semiconductor film, aligning a side surface of the first semiconductor layer and a side surface of the first lower insulating layer with each other, overlapping the entire an entirety of the first lower insulating layer and an entirety of the first semiconductor layer with the first lower conductive layer when viewed from a normal direction of the substrate, and causing an upper surface of the first lower conductive layer to have a protruding portion located outside a peripheral edge of the first semiconductor layer, the protruding portion having a width defined by a width of the second region of the first resist layer, in the at least one second formation region, forming a second substructure including a second lower conductive layer, a second lower insulating layer, and a second semiconductor layer respectively formed from the lower conductive film, the lower insulating film, and the semiconductor film, and in the second substructure, aligning a side surface of the second lower conductive layer, a side surface of the second semiconductor layer, and a side surface of the second lower insulating layer with each other, and in the at least one third formation region, removing the semiconductor film and the lower insulating film, and forming the third substructure including a third lower conductive layer formed from the lower conductive film; and forming a semiconductor element having the first semiconductor layer in the first substructure as an active layer, and/or forming a semiconductor element having the second semiconductor layer in the second substructure as an active layer in the at least one second formation region.

5. The method according to claim 1, wherein the semiconductor element is a thin film transistor (TFT) or a TFT type diode.

6. The method according to claim 4, further comprising forming a wiring using the third substructure.

7. The method according to claim 4, further comprising forming a reflective structure on the substrate by forming a convex-concave structure using at least one of the first substructure, the second substructure, and the third substructure, and covering the convex-concave structure with a metal layer.

* * * * *